(12) United States Patent
Tominaga et al.

(10) Patent No.: US 10,665,713 B2
(45) Date of Patent: May 26, 2020

(54) SILICON CARBIDE SEMICONDUCTOR DEVICE

(71) Applicant: Mitsubishi Electric Corporation, Tokyo (JP)

(72) Inventors: Takaaki Tominaga, Tokyo (JP); Yasushi Takaki, Tokyo (JP); Yoichiro Tarui, Tokyo (JP); Shiro Hino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/041,894

(22) Filed: Jul. 23, 2018

(65) Prior Publication Data

US 2019/0097043 A1   Mar. 28, 2019

(30) Foreign Application Priority Data

Sep. 28, 2017 (JP) .................................. 2017-188708
Apr. 25, 2018 (JP) .................................. 2018-083745

(51) Int. Cl.
*H01L 29/78* (2006.01)
*H01L 29/423* (2006.01)
(Continued)

(52) U.S. Cl.
CPC .......... *H01L 29/7817* (2013.01); *H01L 28/20* (2013.01); *H01L 29/1608* (2013.01);
(Continued)

(58) Field of Classification Search
CPC ............. H01L 29/7817; H01L 29/7803; H01L 29/41775; H01L 29/42372; H01L 29/4238; H01L 29/42376; H01L 29/41725; H01L 29/42364; H01L 29/42356; H01L 29/4232; H01L 29/1608; H01L 28/20
USPC ......... 257/77, 140, 272, 488, 489, 537, 565, 257/E21.004, E21.4, E21.417, E27.016, 257/E27.019, E29.084, E29.197, E29.198; 438/190, 286, 382, 384, 394

See application file for complete search history.

(56) References Cited

U.S. PATENT DOCUMENTS 9,917,102 B2 *   3/2018  Nagao ................. H01L 29/1608
2012/0049323 A1 *   3/2012  Ng ..................... H01L 21/76834
257/537

(Continued)

FOREIGN PATENT DOCUMENTS

JP          2012-109602 A      6/2012

*Primary Examiner* — Dao H Nguyen
(74) *Attorney, Agent, or Firm* — Studebaker & Brackett PC

(57) ABSTRACT

A silicon carbide semiconductor device includes a silicon carbide semiconductor substrate having an n-type drift layer, and a p-type well region formed in a surface portion of a part of the drift layer, an insulating film provided on the well region, a gate built-in resistor formed of polysilicon in contact with a surface of the insulating film, an interlayer insulating film formed on the gate built-in resistor, a gate contact wire that is connected to a gate pad and formed on the interlayer insulating film, a gate wire provided on the interlayer insulating layer so as to be apart from the gate contact wire, a first gate contact for electrically connecting the gate contact wire and the gate built-in resistor, and a second gate contact for electrically connecting the gate wire and the gate built-in resistor.

21 Claims, 21 Drawing Sheets

(51) Int. Cl.
*H01L 29/417* (2006.01)
*H01L 49/02* (2006.01)
*H01L 29/16* (2006.01)

(52) U.S. Cl.
CPC .. *H01L 29/41725* (2013.01); *H01L 29/41775* (2013.01); *H01L 29/4238* (2013.01); *H01L 29/42372* (2013.01); *H01L 29/42376* (2013.01); *H01L 29/7803* (2013.01)

(56) References Cited

U.S. PATENT DOCUMENTS

2013/0020587 A1 1/2013 Hino et al.
2016/0276425 A1* 9/2016 Saito ..................... H01L 28/20

* cited by examiner

SILICON CARBIDE SEMICONDUCTOR DEVICE

BACKGROUND

Field

The present invention relates to a silicon carbide semiconductor device.

Background Art

It is disclosed in FIG. 7 of Japanese Unexamined Patent Application Publication No. 2012-109602 and description part thereof that execution of switching in a semiconductor device using silicon carbide causes a displacement current to flow to a source electrode side, so that large potential occurs in a p-well under a gate pad. Furthermore, it is also disclosed that the potential of the p-well increases as the displacement current is larger, and also increases as dV/dt representing the variation of a drain voltage with time is larger.

As a method of suppressing the potential difference occurring between two points under a gate pad, it is conceivable that Al or B ion implantation is applied to a wafer surface under a gate pad and a gate built-in resistor to form a p-type region and reduce the resistance of the wafer surface, or a source wire is routed around the gate pad.

In a silicon carbide semiconductor device having a gate built-in resistor, a thick field insulating film of, for example, about 1 μm formed in a field process exists under a gate built-in resistor formed of polysilicon. When there is a pinhole in the field insulating film, a thin gate oxide film of, for example, about several tens nanometers which is formed in a gate process exists under the gate built-in resistor.

The semiconductor device disclosed in Japanese Unexamined Patent Application Publication No. 2012-109602 has a risk that when high dV/dt of 100 kV/p sec or more is applied, a large potential difference occurs under the gate built-in resistor due to a displacement current, resulting in deterioration of the gate oxide film. The high dV/dt means that a switching device is driven at a high speed. The contact between the gate built-in resistor and the substrate which is caused by this deterioration of the gate oxide film means that the gate and the source are short-circuited to each other.

A gate pad connected to the gate built-in resistor is formed on a thick interlayer insulating film. Therefore, even if there is a pinhole in the field insulating film, the interlayer insulating film would not be broken when large potential occurs in a p-well at the high dV/dt. In contrast, since there is no interlayer insulating film under the gate built-in resistor, attention must be paid especially so that the gate and the source are not short-circuited to each other.

In a switching device such as MOSFET using silicon carbide as a material, the potential occurring under the gate built-in resistor when high dV/dt is applied cannot be sufficiently suppressed. For example, when a pinhole is formed in the field insulating film under the gate built-in resistor and only a thin gate oxide film remains under the gate built-in resistor, there is a risk that the gate oxide film deteriorates under application of the high dV/dt, and the gate and the source are short-circuited to each other.

SUMMARY

The present invention has been made to solve the problem as described above, and has an object to provide a silicon carbide semiconductor device capable of suppressing short-circuit between a gate and a source.

In some examples, a silicon carbide semiconductor device includes a silicon carbide semiconductor substrate having an n-type drift layer, and a p-type well region formed in a surface portion of a part of the drift layer, an insulating film provided on the well region, a gate built-in resistor formed of polysilicon in contact with a surface of the insulating film, an interlayer insulating film formed on the gate built-in resistor, a gate contact wire that is connected to a gate pad and formed on the interlayer insulating film, a gate wire provided on the interlayer insulating layer so as to be apart from the gate contact wire, a first gate contact for electrically connecting the gate contact wire and the gate built-in resistor, and a second gate contact for electrically connecting the gate wire and the gate built-in resistor.

Other and further objects, features and advantages of the invention will appear more fully from the following description.

DETAILED DESCRIPTION

Silicon carbide semiconductor devices according to embodiments will be described with reference to the drawings. The same or corresponding constituent elements are represented by the same reference signs, and duplicative descriptions thereof may be omitted. The embodiments show one aspect, and do not give a limited interpretation to the present invention. The disclosure contents of the embodiments and drawings described below are examples, and the present invention should not be interpreted restrictively by these examples.

First Embodiment

Figure 1:
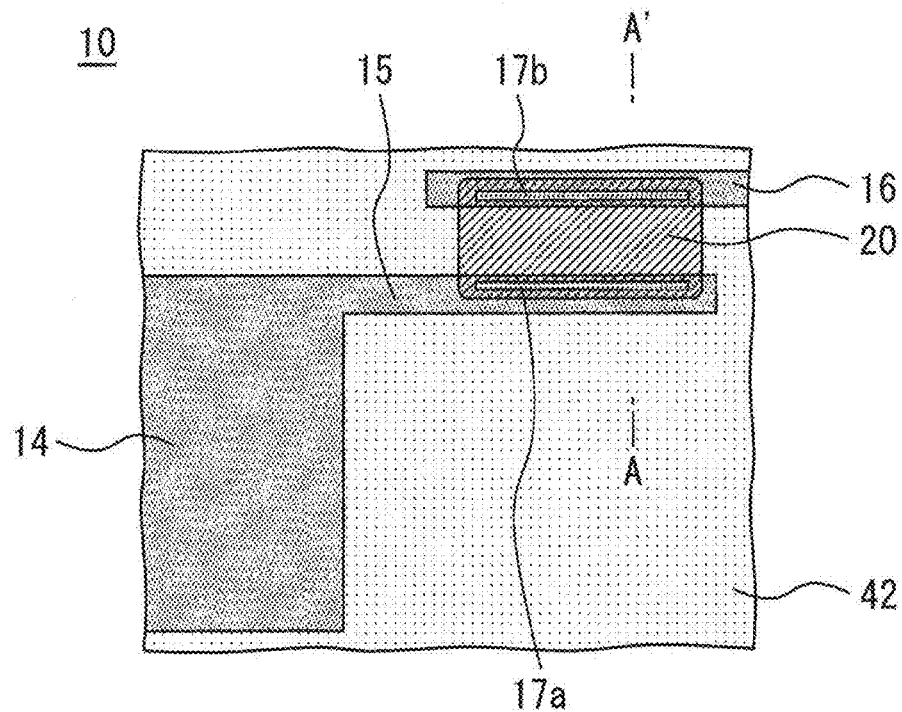
FIG. 1 is a plan view showing a silicon carbide semiconductor device according to a first embodiment.
Figure 2:
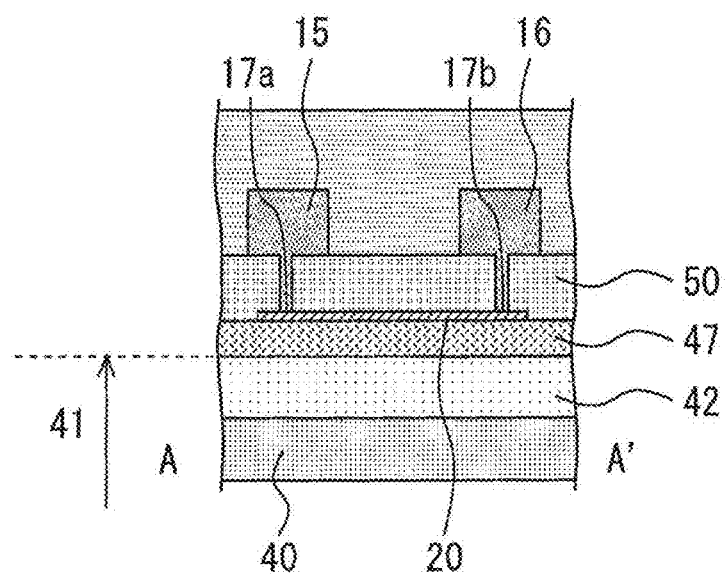
FIG. 2 is a cross-sectional view showing a silicon carbide semiconductor device according to the first embodiment.

FIG. 1 is a plan view showing a silicon carbide semiconductor device according to a first embodiment. FIG. 2 is a cross-sectional view taken along line A-A' of FIG. 1. In FIG. 1, polysilicon connected to a field insulating film, an interlayer insulating film, and a gate built-in resistor is omitted from the illustration for the sake of simplicity. Furthermore, since a gate built-in resistor 20 is embedded inside a silicon carbide semiconductor device 10, it cannot be viewed in plan view. However, for convenience of description, the position of the gate built-in resistor 20 in plan view is shown.

As shown in FIG. 2, the silicon carbide semiconductor device 10 according to the first embodiment includes an n-type drift layer 40. The drift layer 40 is formed on, for example, an n-type substrate 43 shown in FIG. 30 by epitaxial growth or the like. The donor concentration of the drift layer 40 may be set, for example, in the range from $1 \times 10^{14}$ cm$^{-3}$ to $1 \times 10^{17}$ cm$^{-3}$. A silicon carbide semiconductor substrate 41 includes the drift layer 40 and a p-type well region 42 formed in a part of the surface layer portion of the drift layer 40. The acceptor concentration of the well region 42 can be set, for example, in the range of $1 \times 10^{14}$ cm$^{-3}$ to $1 \times 10^{18}$ cm$^{-3}$. The impurity concentration and the thickness of the well region 42 may not be uniform. A field insulating film 47 is provided on the silicon carbide semiconductor substrate 41. That is, the field insulating film 47 is provided as an insulating film on the well region 42. The thickness of an insulating film formed on the well region 42 is the same as the thickness of the field insulating film 47 formed on the well region 42.

Figure 28:
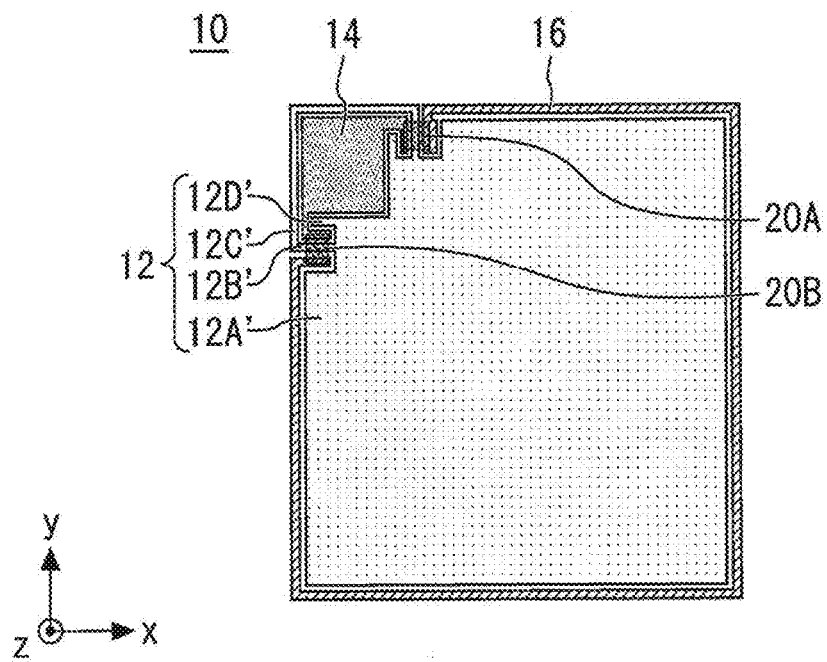
FIG. 28 is a plan view showing a silicon carbide semiconductor device according to a seventeenth embodiment.

A gate built-in resistor 20 is provided on the field insulating film 47. The gate built-in resistor 20 may be formed of polysilicon in contact with the surface of the insulating film. An interlayer insulating film 50 is provided on the gate built-in resistor 20 so as to cover the gate built-in resistor 20 in plan view. A gate contact wire 15 and a gate wire 16 are provided on the interlayer insulating film 50. FIG. 28 shows that the gate contact wire 15 is connected to a gate pad 14. The gate contact wire 15 overlaps the gate built-in resistor 20 in plan view. The gate wire 16 is provided apart from the gate contact wire 15. The gate wire 16 overlaps the gate built-in resistor 20 in plan view. The gate wire 16 faces the gate contact wire 15. For example, the gate wire 16 and the gate contact wire 15 may be provided in parallel to each other.

FIG. 2 shows a first gate contact 17a and a second gate contact 17b. The first gate contact 17a is provided, for example, in a through-hole of the interlayer insulating film 50, and electrically connects the gate contact wire 15 and the gate built-in resistor 20. The second gate contact 17b is provided, for example, in a through-hole of the interlayer insulating film 50, and electrically connects the gate wire 16 and the gate built-in resistor 20.

The drift layer 40 described above can be brought into contact with the bottom surface of the well region 42 or the bottom surface of the field insulating film 47. A gate oxide film may be formed between the field insulating film 47 and the silicon carbide semiconductor substrate 41. The gate pad 14 shown in FIG. 1 is a pad which is provided to mount a gate signal line from the outside of the silicon carbide semiconductor device 10. Therefore, the gate pad 14 has a sufficient area for mounting a signal line. The size of the gate pad 14 may be set to, for example, 30 μm×30 μm or more. The gate pad 14 may be formed of aluminum, for example.

The gate contact wire 15 is formed of the same material as the gate pad 14 so as to have a smaller width than one side of the gate pad 14 and be connected to the gate pad 14. The gate contact wire 15 has, for example, an elongated and linear shape, and one end thereof is in contact with a side surface of the gate pad 14. It is suitable that the width of the gate contact wire 15 is set approximately in the range from not less than 10 μm to not more than 100 μm, for example.

The gate wire 16 is electrically connected to polysilicon formed in a transistor region of the silicon carbide semiconductor device 10. It is suitable that the width of the gate wire 16 is set approximately in the range from not less than 10 μm to not more than 100 μm, for example. The gate wire 16 may be formed of the same material as the gate pad 14. The gate contact wire 15 and the gate wire 16 overlap the gate built-in resistor 20 in plan view. The first gate contact 17a and the second gate contact 17b are provided at these overlap positions.

The gate built-in resistor 20 indicates a polysilicon region including a portion just under the first gate contact 17a and the second gate contact 17b, and a portion sandwiched by the first gate contact 17a and the second gate contact 17b in plan view.

The silicon carbide semiconductor device 10 according to the first embodiment includes a source electrode formed on the interlayer insulating film, for example. For example, a source wire 12 shown in FIG. 28 may be provided. A main body portion 12A' of the source electrode functions as a source pad provided to mount a current line and a signal line from the outside. The source wire formed of the same material as the main body portion 12A' may be connected to the main body portion 12A'. The source wire is, for example, a protruding portion 12D' of FIG. 28. It is suitable that the width of the protruding portion 12D' is set to 10 μm or more.

In the silicon carbide semiconductor device 10 of the first embodiment, the first gate contact 17a for electrically connecting the gate built-in resistor 20 and the gate pad 14 is formed under the gate contact wire 15 drawn out from the gate pad 14. Therefore, it is possible to suppress a displacement current occurring in the well region 42 under the gate pad 14 from flowing into the well region 42 under the gate built-in resistor 20 under application of high dV/dt caused by switching. As a result, the potential occurring in the well region 42 under the gate built-in resistor 20 can be suppressed, and device breakdown caused by the short-circuit between the gate and the source can be prevented.

Second Embodiment

Figure 3:
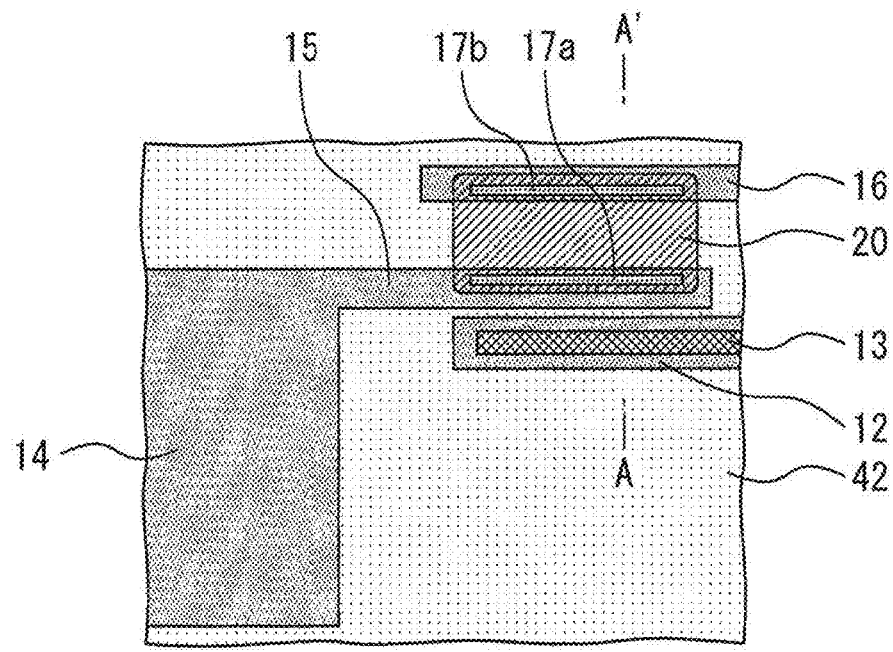
FIG. 3 is a plan view showing a silicon carbide semiconductor device according to a second embodiment.
Figure 4:
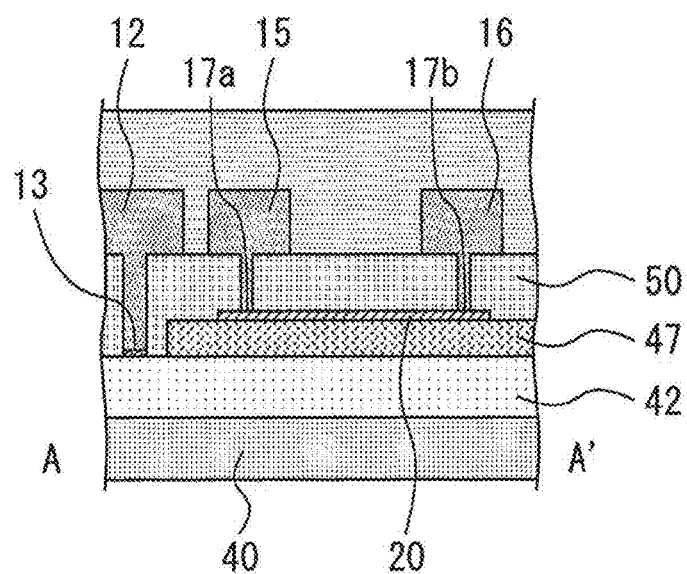
FIG. 4 is a cross-sectional view showing a silicon carbide semiconductor device according to the second embodiment.

FIG. 3 is a plan view showing a silicon carbide semiconductor device according to a second embodiment. In FIG. 3, the silicon carbide semiconductor device is shown while omitting polysilicon connected to the field insulating film 47, the interlayer insulating film 50, and the gate built-in resistor 20 from the illustration for the sake of simplicity. FIG. 4 is a cross-sectional view taken along line A-A' of FIG. 3. The silicon carbide semiconductor device of the second embodiment has many similarities to the first embodiment, and is characterized in the position of a source wire 12, etc.

As shown in FIG. 3, the source wire 12 is provided between the gate built-in resistor 20 and the gate pad 14 in plan view. For example, the source wire 12 may be provided at a portion in which the gate built-in resistor 20 does not exist and which is adjacent to the gate built-in resistor 20 in plan view, and on a line connecting any position of the gate pad 14 and any position of the gate built-in resistor 20 in plan view. A source contact 13 electrically connects the source wire 12 and a well region 42.

FIG. 4 shows that the source contact 13 is provided in a through-hole of the interlayer insulating film 50. The source wire 12 is electrically connected to the well region 42 through the source contact 13. In FIG. 4, the source wire 12 is provided on the interlayer insulating film 50, but the source wire 12 may be provided on the field insulating film 47.

In the silicon carbide semiconductor device according to the second embodiment, the first gate contact 17a is formed in the gate contact wire 15 drawn out from the gate pad 14, and additionally the displacement current occurring in the well region 42 is drawn out through the source contact 13 to the source wire 12. Therefore, the potential occurring in the well region 42 under the gate built-in resistor 20 under application of high dV/dt caused by switching can be suppressed. As a result, it is possible to prevent device breakdown caused by the short-circuit between the gate and the source.

In FIG. 3, the planar shapes of the source contact 13, the first gate contact 17a, and the second gate contact 17b are rectangular shapes. However, for example, plural source contacts 13 may be provided so as to form a source contact having a shape represented by a dashed line as a whole. For example, plural source contacts 13 may be provided discretely and linearly. With respect to each of the first gate contact 17a and the second gate contact 17b, a plurality of gate contacts may be also provided.

Furthermore, the source contact 13, the first gate contact 17a and the second gate contact 17b are provided in parallel to one another in FIG. 3, but the above effect can be obtained even when they are provided in nonparallel to one another. In the following description, the source contact 13 may be formed as one body in an arbitrary shape, or may be formed of plural source contacts arranged discretely. With respect to each of the first gate contact 17a and the second gate contact 17b, it may be also formed as one body, or may be formed of plural gate contacts arranged discretely. When plural source contacts 13, plural first gate contacts 17a or plural second gate contacts 17b are discretely formed, a longitudinal direction thereof when viewed as a whole can be defined.

Third Embodiment

Figure 5:
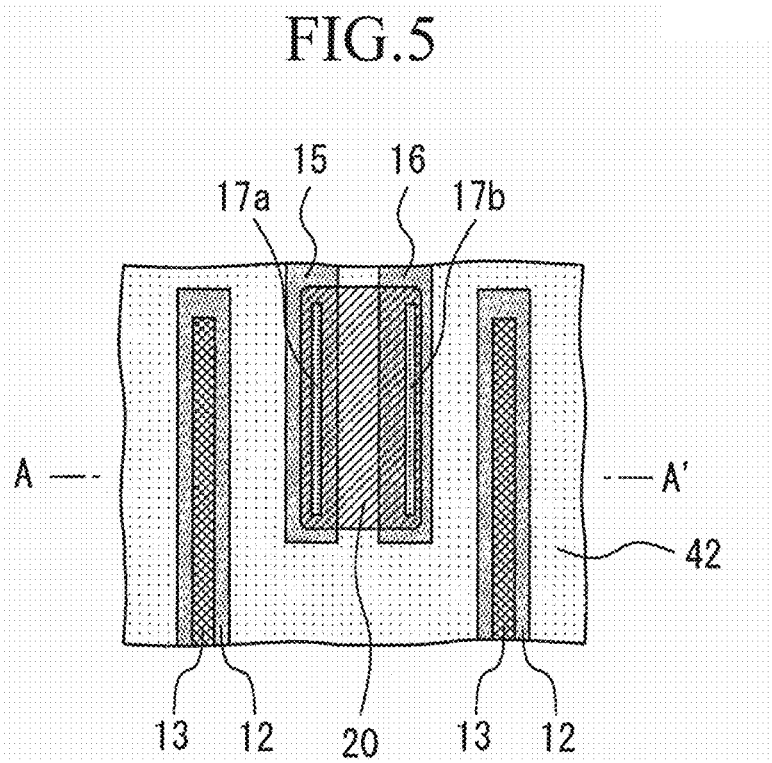
FIG. 5 is a plan view showing a silicon carbide semiconductor device according to a third embodiment.
Figure 6:
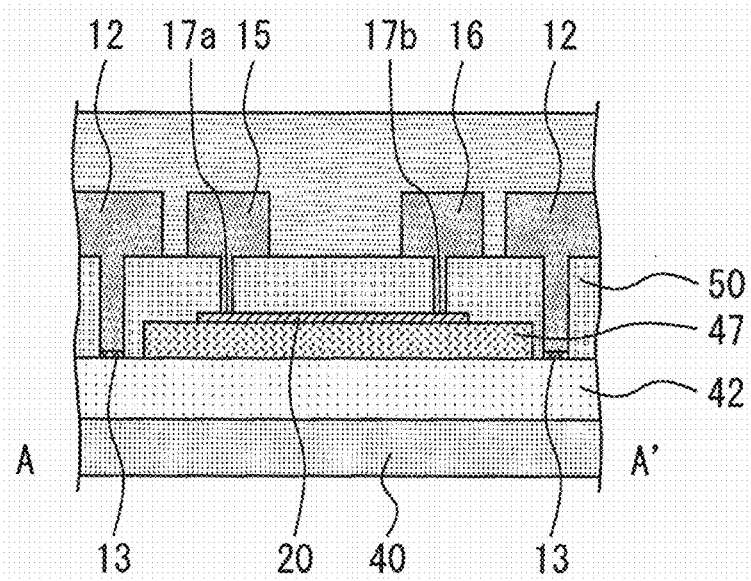
FIG. 6 is a cross-sectional view showing a silicon carbide semiconductor device according to the third embodiment.

FIG. 5 is a plan view of a silicon carbide semiconductor device according to a third embodiment. In FIG. 5, the silicon carbide semiconductor device is shown while omitting polysilicon connected to the field insulating film 47, the interlayer insulating film 50, and the gate built-in resistor 20 from the illustration for the sake of simplicity. FIG. 6 is a cross-sectional view taken along line A-A' of FIG. 5.

FIG. 5 shows two source wires 12 sandwiching the gate contact wire 15 and the gate wire 16 therebetween in plan view. The two source wires 12 are provided at positions where they sandwich the gate built-in resistor 20. The two source wires 12 are provided along the gate contact wire 15 and the gate wire 16. Two source contacts 13 electrically connect the two source wires 12 and the well region 42. The longitudinal directions of the first gate contact 17a, the second gate contact 17b, and the two source contacts 13 are parallel to one another.

In the silicon carbide semiconductor device according to the third embodiment, the first gate contact 17a is formed in the gate contact wire 15 drawn out from the gate pad 14, and additionally the displacement current occurring in the well region 42 are drawn out to the two source wires 12 through the two source contacts 13. Therefore, the potential occurring in the well region 42 under the gate built-in resistor 20 under application of high dV/dt caused by switching can be suppressed, so that it is possible to prevent the device breakdown caused by the short-circuit between the gate and the source.

Fourth Embodiment

Figure 7:
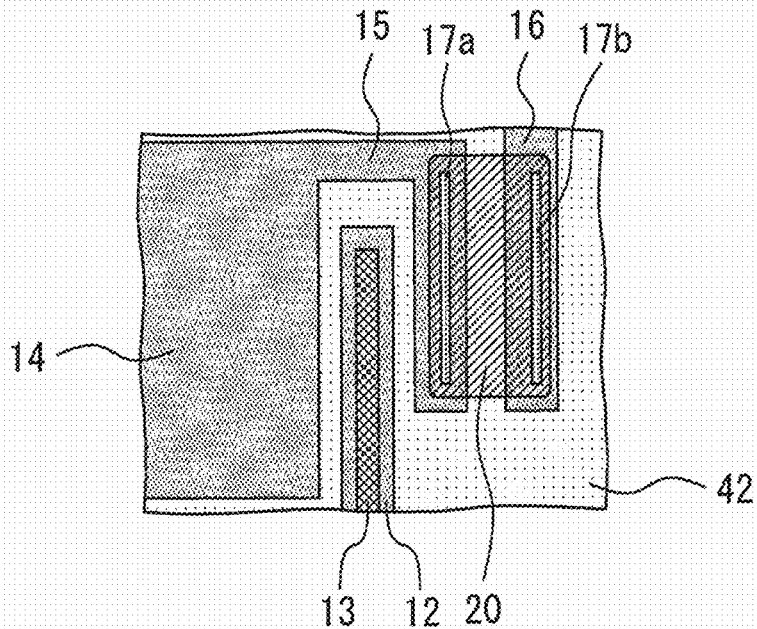
FIG. 7 is a plan view showing a silicon carbide semiconductor device according to a fourth embodiment.

FIG. 7 is a plan view showing a silicon carbide semiconductor device according to a fourth embodiment. In FIG. 7, the silicon carbide semiconductor device is shown while omitting polysilicon connected to the field insulating film 47, the interlayer insulating film 50, and the gate built-in resistor 20 from the illustration for the sake of simplicity. The gate built-in resistor 20 and the gate pad 14 face each other. The source wire 12 and the source contact 13 are provided between the gate built-in resistor 20 and the gate pad 14. The source wire 12 is provided so as to be adjacent to the gate built-in resistor 20 at a place where the gate built-in resistor 20 does not exist. The source wire 12 is formed at a position sandwiched by the gate pad 14 and the gate built-in resistor 20.

In FIG. 7, the shape of the source contact 13 is a single rectangle. However, the shape of the source contact 13 is arbitrary. For example, as shown in FIG. 8, plural source contacts 13 may be provided linearly.

Figure 8:
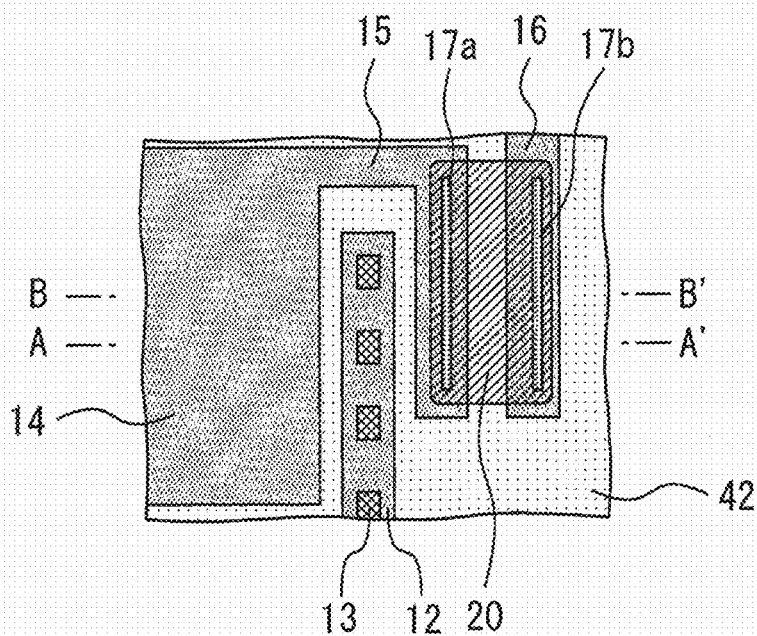
FIG. 8 is a plan view showing a silicon carbide semiconductor device according to the fourth embodiment.
Figure 9:
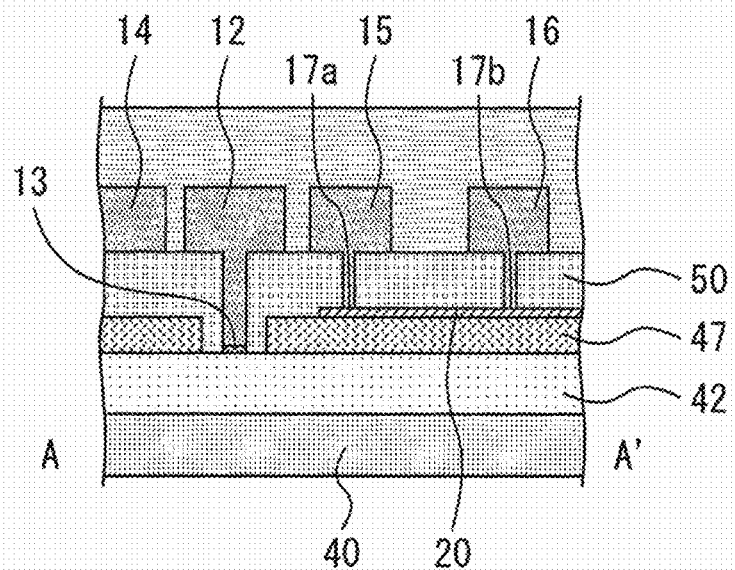
FIG. 9 is a cross-sectional view showing a silicon carbide semiconductor device according to the fourth embodiment.
Figure 10:
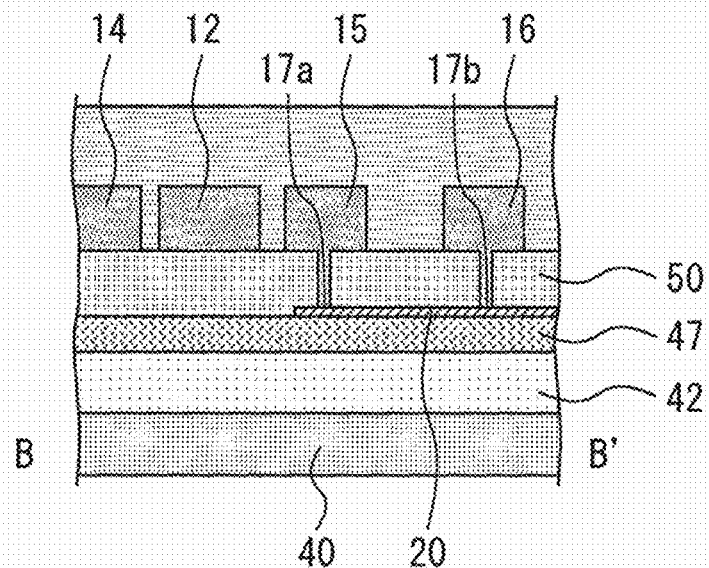
FIG. 10 is a cross-sectional view showing a silicon carbide semiconductor device according to the fourth embodiment.

FIG. 9 is a cross-sectional view taken along as line A-A' of FIG. 8. FIG. 9 shows that the source contact 13 exists next to the gate built-in resistor 20. FIG. 10 is a cross-sectional view taken along a line B-B' of FIG. 8. No source contact 13 exists on this cross-section.

Figure 11:
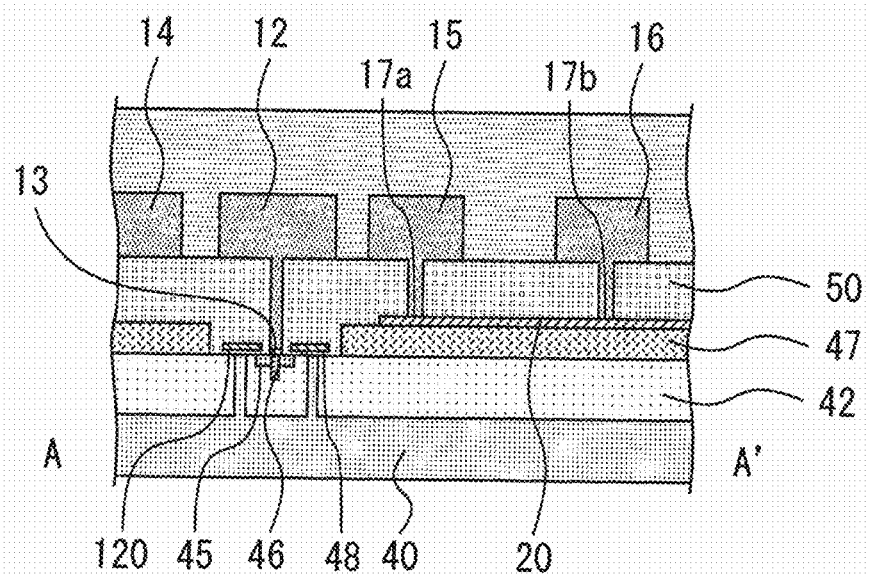
FIG. 11 is a cross-sectional view showing a silicon carbide semiconductor device according to the fourth embodiment.

FIG. 11 is a diagram showing a modification of the cross-sectional view taken along the line A-A' of FIG. 8. That is, the cross-section taken along the line A-A' of FIG. 8 may be as shown in FIG. 9 or as shown in FIG. 11. FIG. 11 shows a gate 120 which is in contact with the source 45, the well region 42 and the drift layer 40 via the gate oxide film 48. The material of the gate 120 is, for example, polysilicon. A transistor structure having the above devices is formed in the cross-sectional view of FIG. 11. The thickness of the gate oxide film 48 and the thickness of the field insulating film 47 may be made coincident with each other.

The source contact 13 is in contact with the well region 42 of the transistor region through a contact region 46, and also in contact with the source 45. The contact region 46 may be made, for example, as a p-type region having an acceptor concentration of $1 \times 10^{19}$ cm$^{-}$ to $1 \times 10^{21}$ cm$^{-3}$. The donor concentration of the source 45 may be set, for example, in the range from $1 \times 10^{18}$ cm$^{-3}$ to $1 \times 10^{20}$ cm$^{-3}$. In FIG. 11, plural well regions 42 are provided apart from one another, and a portion between two well regions 42 functions as a path through which an ON-current of the transistor flows. The plural well regions 42 in FIG. 11 may be connected to one another on the back side or front side of the paper surface of FIG. 11. Such a transistor structure is not limited to a single cell, and may have plural cells on the same cross-section.

The source wire 12 is electrically connected to the well region 42 by the source contact 13. As shown in FIG. 7 or 8, the source wire 12 is formed between the gate built-in resistor 20 and the gate pad 14. Therefore, the displacement current occurring in the well region 42 under the gate built-in resistor 20 is drawn out to the source wire 12 through the source contact 13. As a result, the potential occurring in the well region 42 under the gate built-in resistor 20 under application of high dV/dt caused by switching can be suppressed.

Furthermore, since the source wire 12 and the source contact 13 are formed between the gate built-in resistor 20 and the gate pad 14, the displacement current flowing in the well region 42 under the gate pad 14 can be avoided or suppressed from flowing to the well region 42 under the gate built-in resistor 20. Therefore, the potential occurring in the well region 42 under the gate built-in resistor 20 can be suppressed, and the device breakdown caused by the short-circuit between the gate and the source can be prevented.

Fifth Embodiment

Figure 12:
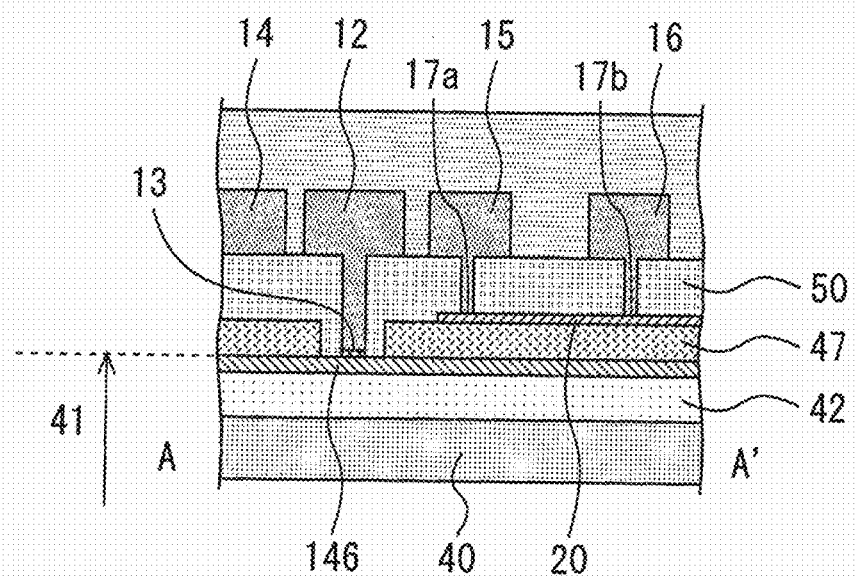
FIG. 12 is a cross-sectional view showing a silicon carbide semiconductor device according to a fifth embodiment.

FIG. 12 is a cross-sectional view showing a silicon carbide semiconductor device according to a fifth embodiment. In the present embodiment, the field insulating film 47 is provided on the silicon carbide semiconductor substrate 41. The gate built-in resistor 20 formed of, for example, polysilicon is provided on the field insulating film 47. The interlayer insulating film 50 is provided on the gate built-in resistor 20. The gate pad 14 is provided on the interlayer insulating film 50. As in the case of the second embodiment, the source wire 12 and the source contact 13 are provided.

The silicon carbide semiconductor device according to the fifth embodiment is similar to the second embodiment, but has a different configuration of the silicon carbide semiconductor substrate 41 from that of the second embodiment. The silicon carbide semiconductor substrate 41 according to the fifth embodiment has a low resistance region 146 in contact with the bottom surface of the field insulating film 47 under the gate built-in resistor 20. Since the low resistance region 146 is formed to be shallower than the well region 42, the well region 42 is in contact with the bottom surface of the low resistance region 146. The low resistance region 146 has lower resistance than the well region 42. The low resistance region 146 is, for example, a high-concentration p-type region. In this case, the acceptor concentration of the low resistance region 146 can be set, for example, in the range from $1 \times 10^{19}$ cm$^{-3}$ to $1 \times 10^{21}$ cm$^{-3}$. The low resistance region 146 may be made as p-type or n-type, but is made to have lower resistance than the well region 42. For example, the sheet resistance of the low resistance region 146 is made smaller than the sheet resistance of the well region 42. The drift layer 40 is in contact with the bottom surface of the well region 42. The drift layer 40 is in contact with the bottom surface of the low resistance region 146 at a place where the well region 42 does not exist. The drift layer 40 is in contact with the bottom surface of the field insulating film 47 at a place where neither the well region 42 nor the low resistance region 146 exists.

The source contact 13 electrically connects the source wire 12 and the low resistance region 146. The source wire 12 of the present embodiment can be formed on the insulating film or the interlayer insulating film between the gate built-in resistor 20 and the gate pad 14 in plan view. That is, for example, the source wire of the present embodiment can be provided at the position of the source wire 12 in FIGS. 7 and 8. Alternatively, the source wire of the present embodiment can be provided at the position of the source wire 12 in FIG. 3. In both the cases, the source contact 13 is brought into contact with the low resistance region 146. By bringing the source contact 13 into contact with the low resistance region 146, the source wire 12 and the well region 42 can be electrically connected to each other with lower resistance. The low resistance region 146 may be provided at any place. The low resistance region 146 can be incorporated in the silicon carbide semiconductor devices according to the embodiments described above or later.

Since the silicon carbide semiconductor device according to the fifth embodiment has the low resistance region 146 under the gate built-in resistor 20, it is possible to suppress the potential occurring due to the displacement current under application of high dV/dt caused by switching. Therefore, it is possible to prevent device breakdown caused by the short-circuit between the gate and the source.

Sixth Embodiment

Figure 13:
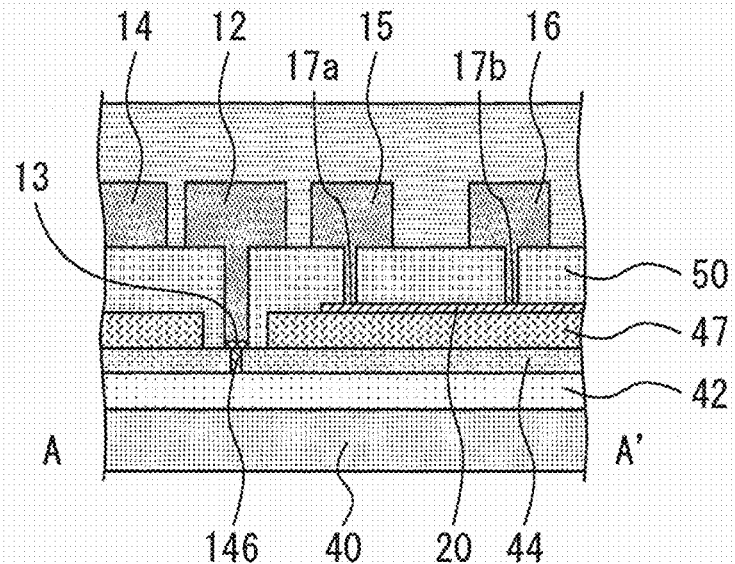
FIG. 13 is a cross-sectional view showing a silicon carbide semiconductor device according to a sixth embodiment.

FIG. 13 is a cross-sectional view of a silicon carbide semiconductor device according to a sixth embodiment. The silicon carbide semiconductor device of the present embodiment is the same as the fifth embodiment in that it has a low resistance region. However, the present embodiment is different from the fifth embodiment in that a high-concentration n-type region 44 is provided, or the p-type low resistance region 146 and the high concentration n-type region 44 are provided side by side. The high-concentration n-type region 44 is, for example, a high-concentration n-type region whose donor concentration is set, for example, in the range from $1\times10^{18}$ cm$^{-3}$ to $1\times10^{20}$ cm$^{-3}$. The high concentration n-type region 44 can be made to have lower resistance than the well region 42. For example, the sheet resistance of the high-concentration n-type region 44 is smaller than the sheet resistance of the well region 42. Since the high-concentration n-type region 44 is formed to be shallower than the well region 42, the bottom surface of the high-concentration n-type region 44 is in contact with the well region 42.

The source wire 12 is electrically connected to at least one of the well region 42 and the high-concentration n-type region 44 via the source contact 13. A high-concentration p-type region may be provided under the source contact 13 to electrically connect the source wire 12 and the well region 42 with lower resistance. The configuration in which the high-concentration n-type region 44 is provided or the p-type low-resistance region 146 and the high-concentration n-type region 44 are provided side by side may be provided at any place. The configuration in which the high-concentration n-type region 44 is provided or the p-type low-resistance region 146 and the high-concentration n-type region 44 are provided side by side can be incorporated into the silicon carbide semiconductor devices according to the embodiments described above or later.

Since the silicon carbide semiconductor device according to the sixth embodiment has the high-concentration n-type region 44 under the gate built-in resistor 20, it is possible to suppress the potential occurring due to the displacement current under applying of high dV/dt caused by switching. Therefore, it is possible to prevent the device breakdown caused by the short-circuit between the gate and the source. In the fifth and sixth embodiments, the source wire 12 and the source contact 13 are not indispensable.

Seventh Embodiment

Figure 14:
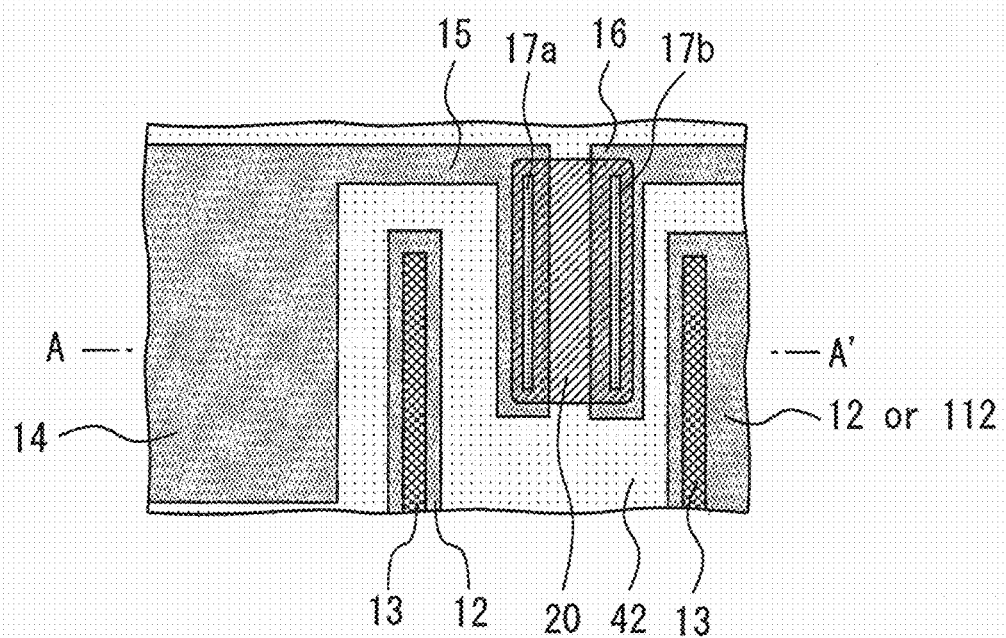
FIG. 14 is a plan view showing a silicon carbide semiconductor device according to a seventh embodiment.

FIG. 14 is a plan view showing a silicon carbide semiconductor device according to a seventh embodiment. In FIG. 14, the silicon carbide semiconductor device is shown while polysilicon connected to the field insulating film 47, the interlayer insulating film 50, and the gate built-in resistor 20 is omitted from the illustration for the sake of simplicity. The silicon carbide semiconductor device of the present embodiment adopts a structure in which two source contacts 13 face each other with the gate built-in resistor 20 interposed therebetween as described with respect to the third embodiment. The right-side source contact 13 of the present embodiment electrically connects the source wire 12 or a source pad 112 and the well region 42. The source wire 12 and the source contact 13 on the left side of the gate built-in resistor 20 are provided between the gate built-in resistor 20 and the gate pad 14. The left-side source contact 13 electrically connects the source wire 12 and the well region 42.

Figure 15:
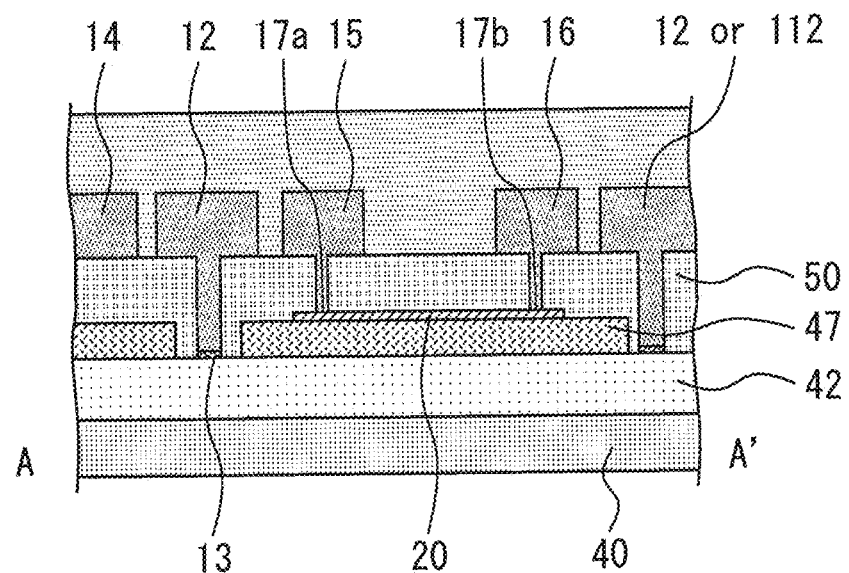
FIG. 15 is a cross-sectional view showing a silicon carbide semiconductor device according to the seventh embodiment.

FIG. 15 is a cross-sectional view taken along a line A-A' of FIG. 14. FIG. 15 shows that the source contacts 13 are provided on both sides of the gate built-in resistor 20. Under application of high dV/dt caused by switching, the displacement current occurring in the well region 42 under the gate built-in resistor 20 is drawn out to the source wires 12 or the source pad 112 through the source contacts 13 provided on both sides of the gate built-in resistor 20. Therefore, the potential occurring in the well region 42 under the gate built-in resistor 20 can be suppressed, and the device breakdown caused by the short-circuit between the gate and the source can be prevented.

Eighth Embodiment

Figure 16:
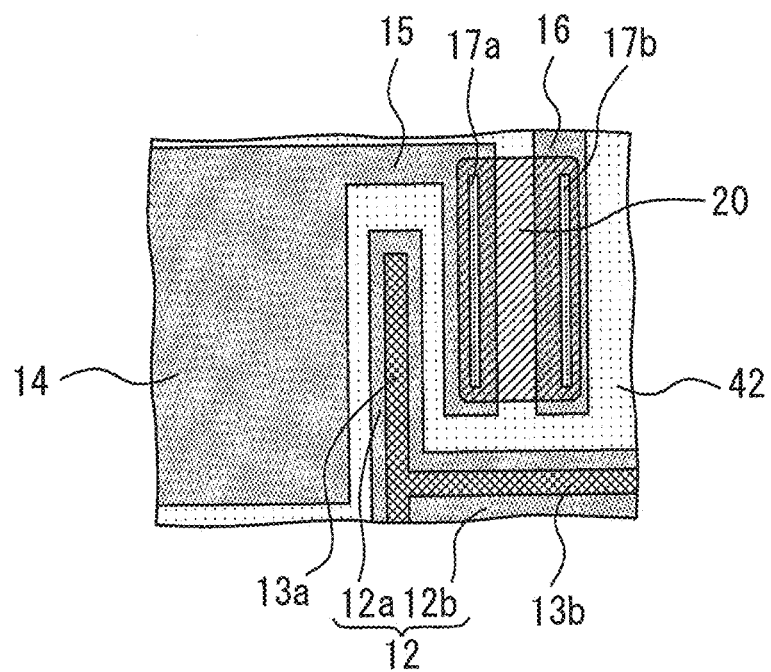
FIG. 16 is a plan view showing a silicon carbide semiconductor device according to an eighth embodiment.

FIG. 16 is a plan view of a silicon carbide semiconductor device according to an eighth embodiment. In FIG. 16, the silicon carbide semiconductor device is shown while polysilicon connected to the field insulating film 47, the interlayer insulating film 50, and the gate built-in resistor 20 is omitted from the illustration for the sake of simplicity. The source wire 12 of the present embodiment has a first portion 12a and a second portion 12b. The first portion 12a is provided along the gate built-in resistor 20 between the gate built-in resistor 20 and the gate pad 14 in plan view. The second portion 12b is connected to the first portion 12a, extends in a direction different from that of the first portion 12a and adjoins the gate built-in resistor 20. The first portion 12a is a portion corresponding to the source wire 12 of the fourth embodiment. The first source contact 13a electrically connects the first portion 12a and the well region 42. The first portion 12a and the low resistance region may be electrically connected to each other by the first source contact 13a.

The longitudinal direction of the second portion 12b is nonparallel to the longitudinal direction of the first portion 12a. The second portion 12b is provided at a position adjacent to the gate built-in resistor 20. The second portion 12b is not a part of the source wire, but may be made as a part of the source pad 112. The second source contact 13b electrically connects the second portion 12b and the well region 42. The second portion 12b and the low resistance region may be electrically connected to each other by the second source contact 13b.

In the present embodiment, the first source contact 13a is provided along one side of the gate built-in resistor 20, and the second source contact 13b is provided along another side of the gate built-in resistor. Therefore, the source contacts are provided at positions facing the two sides of the gate built-in resistor 20. The source contacts may be provided at positions facing three or more sides of the gate built-in resistor 20. In other words, it is possible to provide as a long source contact as possible along the outer edge of the gate built-in resistor 20.

In the silicon carbide semiconductor device of the eighth embodiment, under application of high dV/dt caused by switching, the displacement current occurring in the well region 42 under the gate built-in resistor 20 is drawn out to the source wire 12 or the source pad 112 through the two source contacts provided along the two sides of the gate built-in resistor 20. Therefore, the potential occurring in the well region 42 under the gate built-in resistor 20 can be suppressed, and the device breakdown caused by the short-circuit between the gate and the source can be prevented.

Ninth Embodiment

Figure 17:
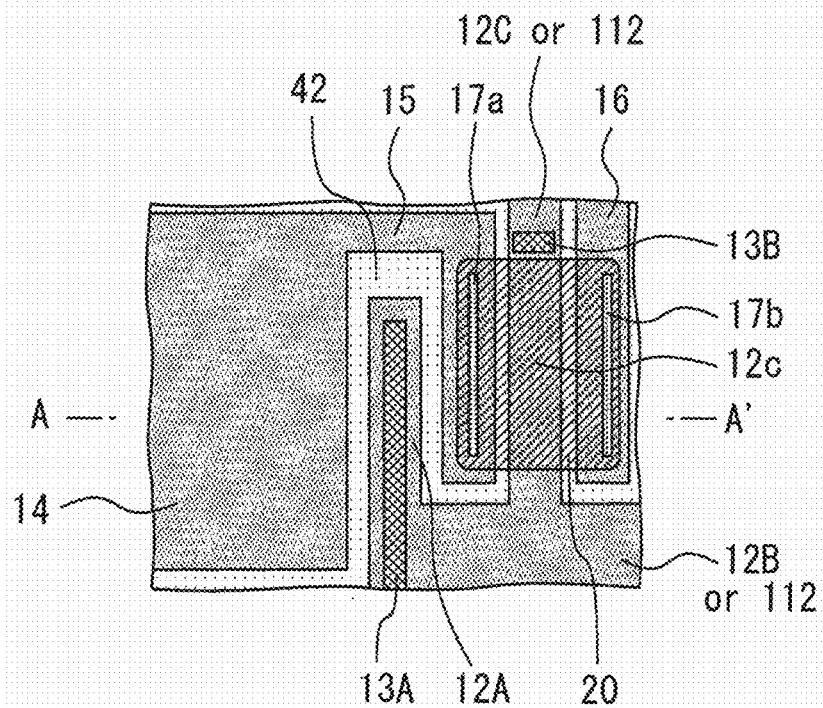
FIG. 17 is a plan view showing a silicon carbide semiconductor device according to a ninth embodiment.

FIG. 17 is a plan view showing a silicon carbide semiconductor device according to a ninth embodiment. In FIG. 17, the silicon carbide semiconductor device is shown while polysilicon connected to the field insulating film 47, the interlayer insulating film 50, and the gate built-in resistor 20 is omitted from the illustration for the sake of simplicity. As in the case of the fourth embodiment, the silicon carbide semiconductor device of the present embodiment includes a source wire 12A and a source contact 13A between the gate built-in resistor 20 and the gate pad 14. The source contact 13A electrically connects the source wire 12A and the well region 42 or the low resistance region.

Another source wire 12B or the source pad 112 is connected to the source wire 12A. A source contact may be formed on the source wire 12B or the source pad 112. A just-above portion 12c is formed via the interlayer insulating film above the gate built-in resistor 20 between the gate contact wire 15 and the gate wire 16. The just-above portion 12c is a part of the source wire 12C that longitudinally traverses the gate built-in resistor 20 in plan view. A source contact 13B is provided at a portion of the source wire 12C above the just-above portion 12c. The longitudinal direction of the source contact 13B is nonparallel to the longitudinal direction of the source contact 13A. The source contact 13A is provided along the left side of the gate built-in resistor 20, whereas the source contact 13B is provided along the upper side of the gate built-in resistor 20. As a result, the source contacts 13A and 13B can be provided to be located such that these contacts sandwich the gate contact wire 15 therebetween. The source contact 13B electrically connects the source wire 12C and the well region 42 or the low resistance region.

Figure 18:
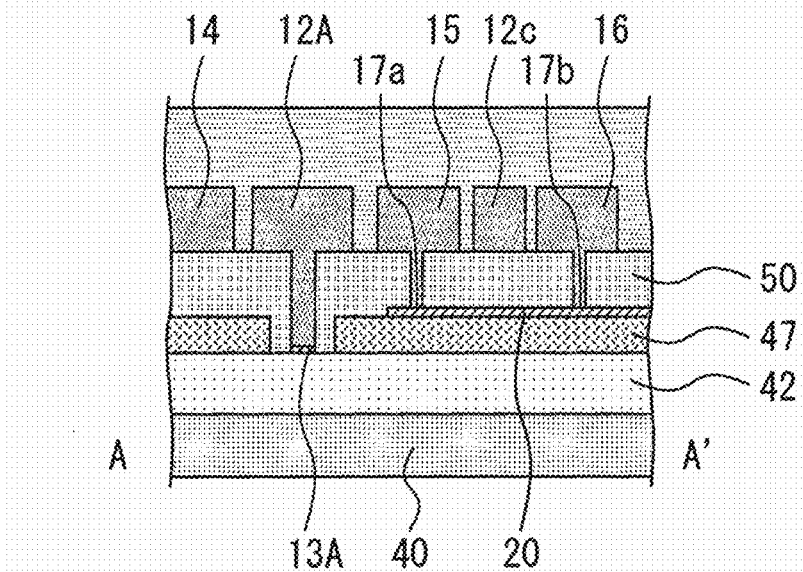
FIG. 18 is a cross-sectional view showing a silicon carbide semiconductor device according to the ninth embodiment.

FIG. 18 is a cross-sectional view taken along a line A-A' of FIG. 17. The just-above portion 12c constituting a part of the source wire is provided on the interlayer insulating film 50. In the silicon carbide semiconductor device according to the ninth embodiment, under application of the high dV/dt caused by switching, the displacement current occurring in the well region 42 under the gate built-in resistor 20 is drawn out to the source wire 12 or the source pad 112 through the source contacts 13A and 13B which are provided along the two orthogonal sides of the gate built-in resistor 20. Therefore, the potential occurring in the well region 42 under the gate built-in resistor 20 can be suppressed, and the device breakdown caused by the short-circuit between the gate and the source can be prevented.

Tenth Embodiment

Figure 19:
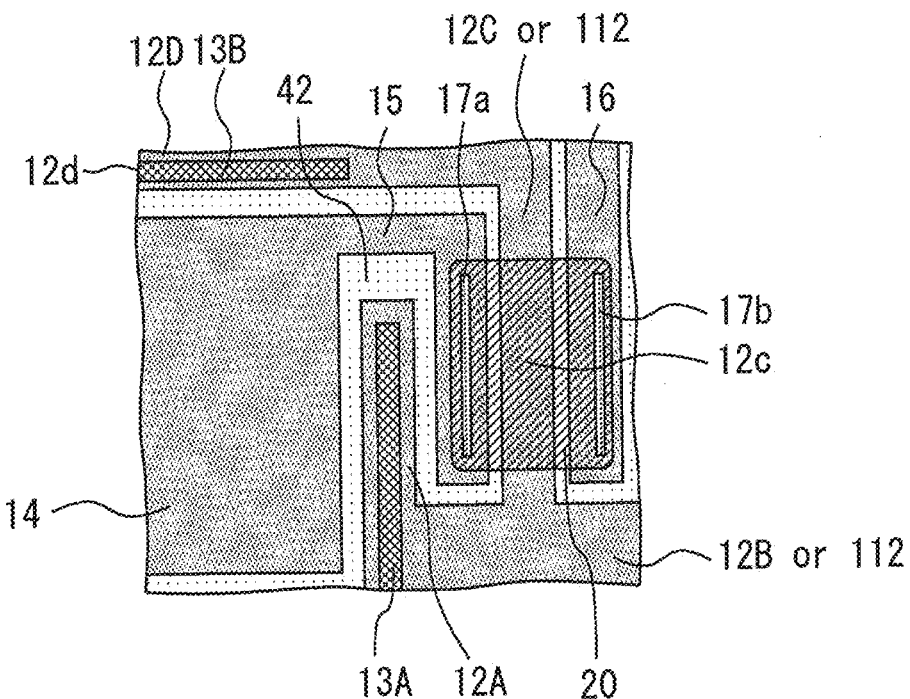
FIG. 19 is a plan view showing a silicon carbide semiconductor device according to a tenth embodiment.

FIG. 19 is a plan view showing a silicon carbide semiconductor device according to a tenth embodiment. In FIG. 19, the silicon carbide semiconductor device is shown while polysilicon connected to the field insulating film 47, the interlayer insulating film 50, and the gate built-in resistor 20 is omitted from the illustration for the sake of simplicity. As in the case of the fourth embodiment, the silicon carbide semiconductor device of the present embodiment includes the source wire 12A and the source contact 13A between the gate built-in resistor 20 and the gate pad 14. The source contact 13A electrically connects the source wire 12A and the well region 42 or the low resistance region.

Another source wire 12B or the source pad 112 is connected to the source wire 12A. A source contact may be formed on the source wire 12B or the source pad 112. Furthermore, as in the case of the ninth embodiment, a source wire 12C is provided which longitudinally traverses the gate built-in resistor 20 in plan view. A just-above portion 12c is formed as a part of the source wire 12C. A source wire 12D is connected to the source wire 12C. The source wire 12D has an adjacent portion 12d at a position adjacent to the gate pad 14 in plan view. The adjacent portion 12d may be formed on the field insulating film 47 or the interlayer insulating film 50. The source wires 12B, 12C, and 12D may be formed as source pads 112.

A source contact 13B is provided to be adjacent to the gate pad 14. The source contact 13B penetrates through, for example, the field insulating film 47 or the interlayer insulating film 50, and electrically connects the adjacent portion 12d and the well region 42.

In the silicon carbide semiconductor device according to the tenth embodiment, the source wire 12A which is electrically connected to the well region 42 through the source contact 13A is formed between the gate built-in resistor 20 and the gate pad 14. Therefore, under application of high dV/dt caused by switching, the displacement current occurring in the well region 42 under the gate built-in resistor 20 is drawn out to the source wire 12 through the source contact 13A. Furthermore, the displacement current occurring in the well region 42 under the gate pad 14 is drawn out through the source contact 13B provided to be adjacent to the gate pad 14. Therefore, the potential occurring in the well region 42 under the gate built-in resistor 20 can be suppressed, and the device breakdown caused by the short-circuit between the gate and the source can be prevented.

Eleventh Embodiment

Figure 20:
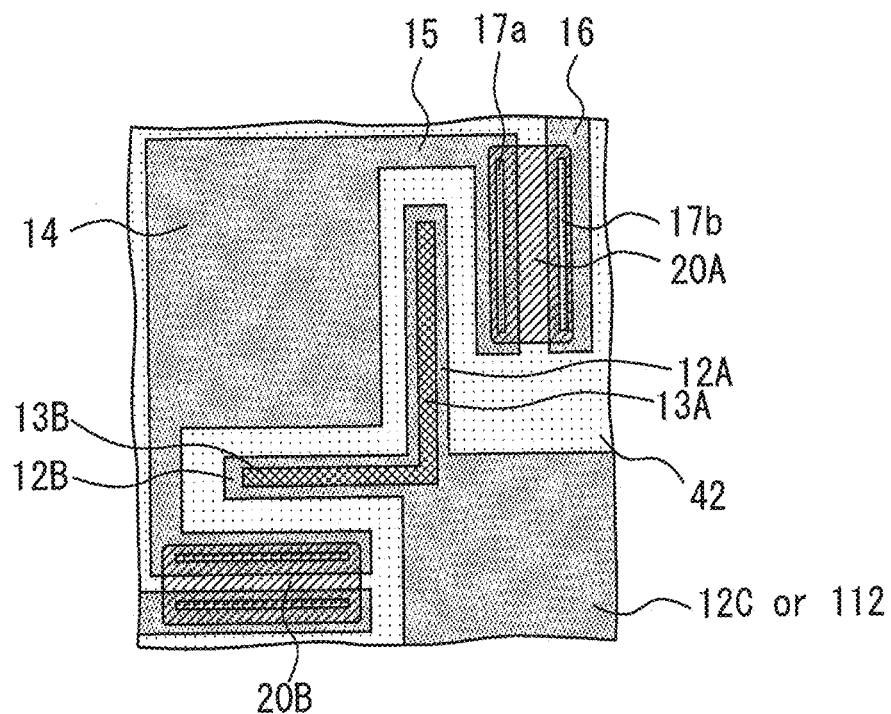
FIG. 20 is a plan view showing a silicon carbide semiconductor device according to an eleventh embodiment.

FIG. 20 is a plan view showing a silicon carbide semiconductor device according to an eleventh embodiment. In FIG. 20, and the silicon carbide semiconductor device is shown while polysilicon connected to the field insulating film 47, the interlayer insulating film 50 and the gate built-in resistor 20 is omitted from the illustration for the sake of simplicity. In the present embodiment, two gate built-in resistors are provided. A gate built-in resistor 20A is provided on the right side of the gate pad 14, and a gate built-in resistor 20B is provided under the gate pad 14. As described above, the two gate built-in resistors are provided in parallel along two nonparallel sides of the gate pad 14.

A source wire 12A and a source contact 13A are provided between the gate pad 14 and the gate built-in resistor 20A. The source contact 13A electrically connects the source wire 12A and the well region 42 or the low resistance region. A source wire 12B and a source contact 13B are provided between the gate pad 14 and the gate built-in resistor 20B. The source contact 13B electrically connects the source wire 12B and the well region 42 or the low resistance region. The source wires 12A and 12B and the source contacts 13A and 13B face the two sides of the gate pad 14 when viewed as a whole. The source wires 12C or the source pad 112 is connected to the source wires 12A and 12B.

Since the silicon carbide semiconductor device of the eleventh embodiment has a structure having higher symmetry than the structure of the fourth embodiment, under application of high dV/dt caused by switching, the displacement current flows more symmetrically, and the reliability of the device is enhanced. In addition, since two gate built-in resistors 20A and 20B are provided, as compared with a case where one gate built-in resistor 20 is provided as in the case of the fourth embodiment, the gate built-in resistance per gate built-in resistor can be made smaller in the case of the same resistance value as compared with a case where one gate built-in resistor is provided as in the case of the fourth embodiment. Therefore, it is possible to suppress the potential occurring in the well region 42 under the gate built-in resistors 20A and 20B and prevent the device breakdown caused by the short-circuit between the gate and the source.

Twelfth Embodiment

Figure 21:
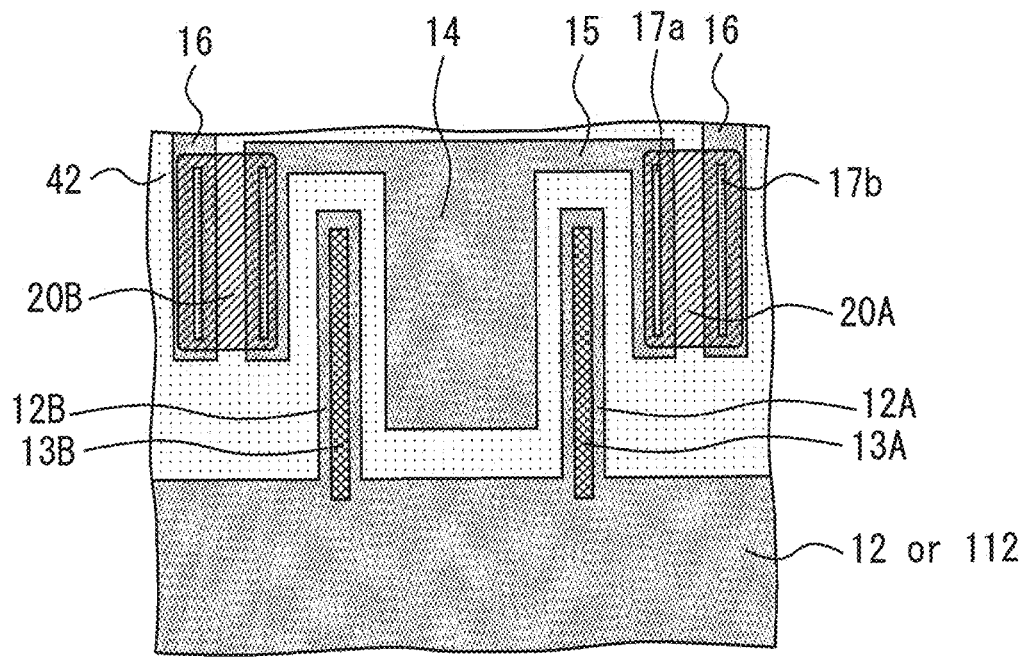
FIG. 21 is a plan view showing a silicon carbide semiconductor device according to a twelfth embodiment.

FIG. 21 is a plan view showing a silicon carbide semiconductor device according to a twelfth embodiment. In FIG. 21, the silicon carbide semiconductor device is shown while polysilicon connected to the field insulating film 47, the interlayer insulating film 50 and the gate built-in resistor 20 is omitted from the illustration for the sake of simplicity. The gate built-in resistor 20A is provided on the right side of the gate pad 14, and the gate built-in resistor 20B is provided on the left side of the gate pad 14. The gate built-in resistors 20A and 20B are provided at positions where they sandwich the gate pad 14 therebetween. The two gate built-in resistors 20A and 20B are provided in parallel along two parallel sides of the gate pad 14.

The source wire 12A and the source contact 13A are provided between the gate pad 14 and the gate built-in resistor 20A. The source contact 13A electrically connects the source wire 12A and the well region 42 or the low resistance region. The source wire 12B and the source contact 13B are provided between the gate pad 14 and the gate built-in resistor 20B. The source contact 13B electrically connects the source wire 12B and the well region 42 or the low resistance region.

Since the silicon carbide semiconductor device of the twelfth embodiment has a structure having higher symmetry as compared with that of the fourth embodiment, the displacement current flows more symmetrically under application of high dV/dt caused by switching, and the reliability of the device is enhanced. In addition, since the two gate built-in resistors 20A and 20B are provided, the gate built-in resistance per gate built-in resistor can be made smaller in the case of the same resistance as compared with a case where one gate built-in resistor is provided as in the case of the fourth embodiment. Therefore, it is possible to suppress the potential occurring in the well region 42 under the gate built-in resistors 20A and 20B, and prevent the device breakdown caused by the short-circuit between the gate and the source.

Thirteenth Embodiment

Figure 22:
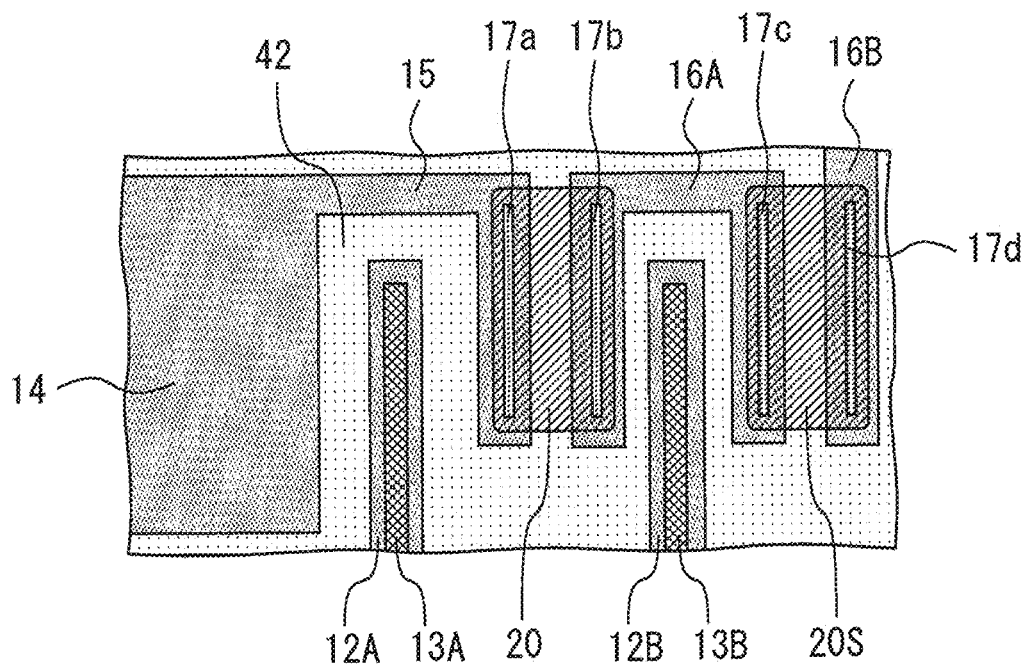
FIG. 22 is a plan view showing a silicon carbide semiconductor device according to a thirteenth embodiment.

FIG. 22 is a plan view of a silicon carbide semiconductor device according to a thirteenth embodiment. In FIG. 22, the silicon carbide semiconductor device is shown while polysilicon connected to the field insulating film 47, the interlayer insulating film 50, and the gate built-in resistor 20 is omitted from the illustration for the sake of simplicity. In the present embodiment, two gate built-in resistors are provided in series on the wires connected to the gate pad 14.

The silicon carbide semiconductor device according to the thirteenth embodiment includes the gate contact wire 15, a gate wire 16A, and an auxiliary gate wire 16B. The gate contact wire 15 faces the gate wire 16A. Furthermore, the gate wire 16A and the auxiliary gate wire 16B face each other.

The gate built-in resistor 20 is provided so as to overlap the gate contact wire 15 and the gate wire 16A in plan view. The gate contact wire 15 and the gate built-in resistor 20 are electrically connected to each other by a first gate contact 17a. In addition, the gate wire 16A and the gate built-in resistor 20 are electrically connected to each other by a second gate contact 17b.

An auxiliary gate built-in resistor 20S is provided so as to overlap the gate wire 16A and the auxiliary gate wire 16B in plan view. The auxiliary gate built-in resistor 20S can be formed of, for example, polysilicon which is in contact with the surface of the insulating film. The gate wire 16A and the auxiliary gate built-in resistor 20S are electrically connected to each other by a third gate contact 17c. The auxiliary gate wire 16B and the auxiliary gate built-in resistor 20S are electrically connected to each other by a fourth gate contact 17d. In this way, the gate built-in resistor 20 and the auxiliary gate built-in resistor 20S are connected in series to each other.

The source wire 12A and the source contact 13A are provided between the gate pad 14 and the gate built-in resistor 20. The source contact 13A connects the source wire 12A and the well region 42 or the low resistance region. The source wire 12B and the source contact 13B are provided between the gate built-in resistor 20 and the auxiliary gate built-in resistor 20S in plan view. The source contact 13B electrically connects the source wire 12B and the well region 42 or the low resistance region. The low resistance region is a region having lower resistance than the well region.

In the silicon carbide semiconductor device of the thirteenth embodiment, since the gate built-in resistor 20 and the auxiliary gate built-in resistor 20S are provided in series, under application of high dV/dt caused by switching, the gate built-in resistance per gate built-in resistor can be made smaller in the case of the same resistance value as compared with a case where one gate built-in resistor is provided as in the case of the fourth embodiment. Therefore, the potential occurring in the well region under the gate built-in resistor 20 and the auxiliary gate built-in resistor 20S can be suppressed. Therefore, it is possible to prevent the device breakdown caused by the short-circuit between the gate and the source. In the present embodiment, the example in which two gate built-in resistors are provided in series has been described, but three or more gate built-in resistors may be provided in series.

Fourteenth Embodiment

Figure 23:
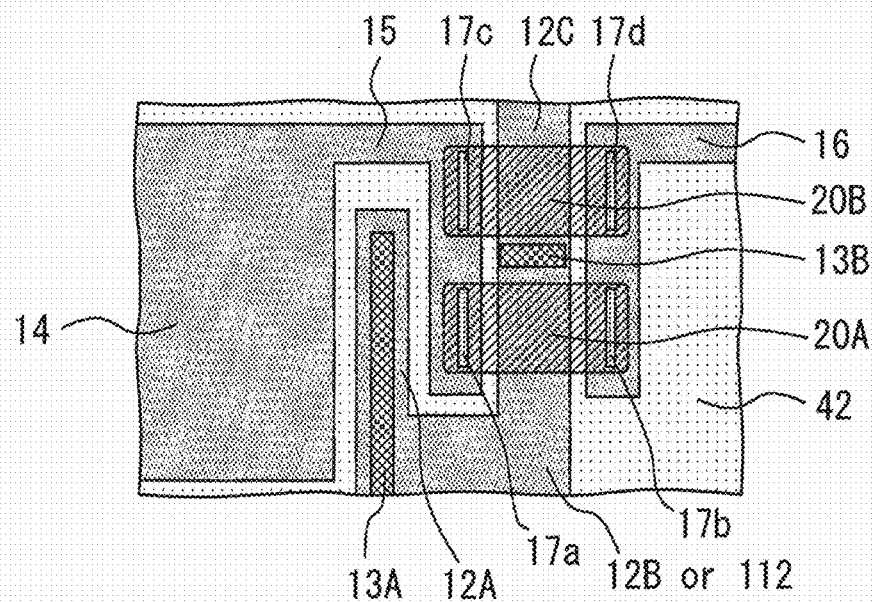
FIG. 23 is a plan view showing a silicon carbide semiconductor device according to a fourteenth embodiment.

FIG. 23 is a plan view of a silicon carbide semiconductor device according to a fourteenth embodiment. In FIG. 23, the silicon carbide semiconductor device is shown while polysilicon connected to the field insulating film 47, the interlayer insulating film 50, and gate built-in resistors 20A and 20B is omitted from the illustration for the sake of simplicity. In the present embodiment, two gate built-in resistors are provided in parallel on the wires connected to the gate pad 14.

The two gate built-in resistors 20A and 20B connect the gate contact wire 15 and the gate wire 16. More specifically, the gate built-in resistor 20A is connected to the gate contact wire 15 by the first gate contact 17a, and also connected to the gate wire 16 by the second gate contact 17b. The gate built-in resistor 20B is connected to the gate contact wire 15 by the third gate contact 17c and also connected to the gate wire 16 by the fourth gate contact 17d. As described above, plural structures each including the gate built-in resistor, the first gate contact and the second gate contact are provided, so that plural gate built-in resistors are connected in parallel to each another. The configuration as described above can be regarded as a configuration in which the gate built-in resistor 20 of the fourth embodiment shown in FIG. 7 is divided into two gate built-in resistors connected in parallel.

The source wire 12A and the source contact 13A are provided between the gate built-in resistors 20A and 20B and the gate pad 14. The source contact 13A electrically connects the source wire 12A and the well region 42 or the low resistance region. The source wire 12B or the source pad 112 is connected to the source wire 12A. A source wire 12C extending so as to traverse the gate built-in resistors 20A and 20B is formed in the source wire 12B or the source pad 112 between the gate contact wire 15 and the gate wire 16. The source wire 12C has a just-above portion passing over the gate built-in resistors 20A and 20B. The source contact 13B is formed at a portion of the source wire 12C which is formed between the gate built-in resistor 20A and the gate built-in resistor 20B in plan view. The source contact 13B electrically connects the source wire 12C and the well region or the low resistance region having lower resistance than the well region. As a result, the source contact 13B is provided between the first gate built-in resistor 20A and the second gate built-in resistor 20B.

In the silicon carbide semiconductor device according to the fourteenth embodiment, since the two gate built-in resistors 20A and 20B are provided in parallel, the gate built-in resistance per gate built-in resistor can be made smaller in the case of the same resistance as compared with a case where one gate built-in resistor 20 is provided. Therefore, under application of high dV/dt caused by switching, the potential occurring in the well region under each gate built-in resistor can be suppressed.

As described above, since the source contact 13B for electrically connecting the source wire 12C and the well region is provided between the gate built-in resistor 20A and the gate built-in resistor 20B, the displacement current is also drawn out to the source wire 12C. Therefore, it is possible to suppress the potential occurring in the well region 42 under each gate built-in resistor and prevent the device breakdown caused by the short-circuit between the gate and the source. In the present embodiment, the example in which the two gate built-in resistors 20A and 20B are provided in parallel and the source contact 13B is formed between the two gate built-in resistors 20A and 20B has been described. However, the same effect can be obtained even when three or more gate built-in resistors are provided.

Fifteenth Embodiment

Figure 24:
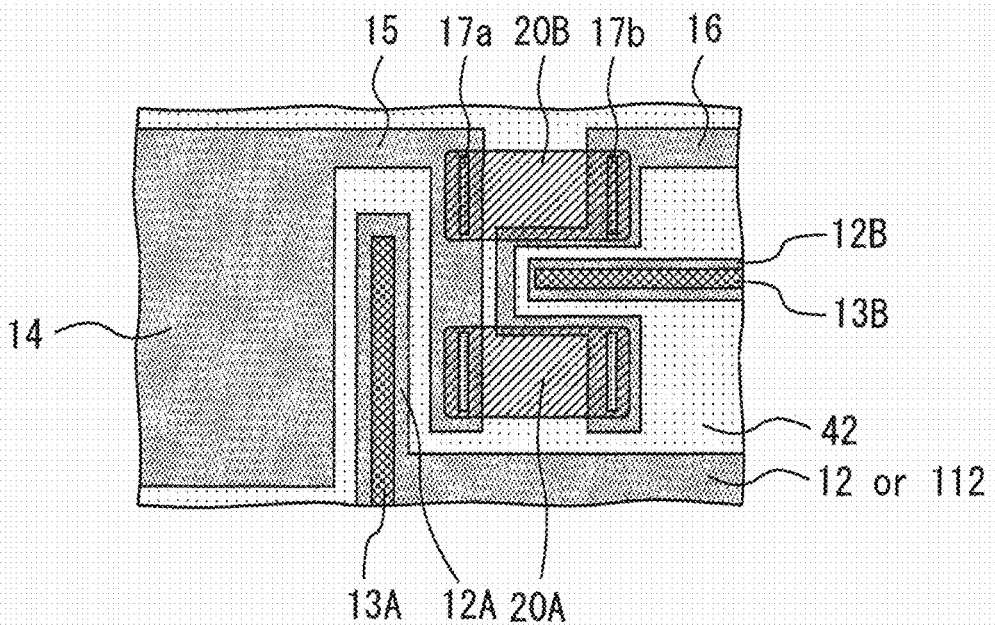
FIG. 24 is a plan view showing a silicon carbide semiconductor device according to a fifteenth embodiment.

FIG. 24 is a plan view showing a silicon carbide semiconductor device according to a fifteenth embodiment. In FIG. 24, the silicon carbide semiconductor device is shown while polysilicon connected to the field insulating film 47, the interlayer insulating film 50 and the gate built-in resistors 20A and 20B is omitted from the illustration for the sake of simplicity. The present embodiment is basically similar to the fourteenth embodiment because the gate built-in resistors 20A and 2B are connected in parallel to each other. Furthermore, the present embodiment is also the same as the fourteenth embodiment in that the source contact 13B is provided between the first gate built-in resistor 20A and the second gate built-in resistor 20B, but different in the configuration for providing such a source contact.

As shown in FIG. 24, the gate wire 16 has a portion protruding to the gate contact wire 15 at a portion thereof facing the gate contact wire 15. The source wire 12B and the source contact 13B are provided in a space generated by protruding the gate wire 16 as described above. The source wire 12B and the source contact 13B are located between the gate built-in resistor 20A and the gate built-in resistor 20B. The source contact 13B electrically connects the source wire 12B and the well region 42 or the low resistance region. As described above, the source wire 12B and the source contact 13B are provided between the gate built-in resistor 20A and the gate built-in resistor 20B without providing any source wire passing over the gate built-in resistors 20A and 20B described in the fourteenth embodiment.

Figure 25:
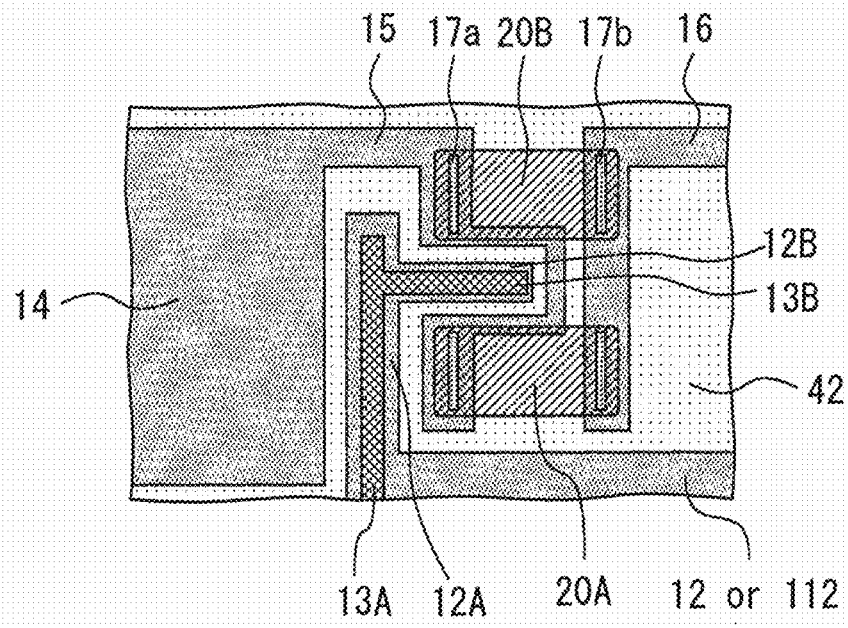
FIG. 25 is a plan view showing a silicon carbide semiconductor device according to the fifteenth embodiment.

FIG. 25 is a plan view showing a modification of the silicon carbide semiconductor device of the fifteenth embodiment. The gate contact wire 15 has a portion protruding to the gate wire 16 at a portion thereof facing the gate wire 16. The source wire 12B and the source contact 13B are provided in a space generated by protruding the gate contact wire 15 as described above. The source wire 12B and the source contact 13B are located between the gate built-in resistor 20A and the gate built-in resistor 20B.

In the silicon carbide semiconductor device of the fifteenth embodiment, since the two gate built-in resistors 20A and 20B are provided in parallel, the gate built-in resistance per gate built-in resistor can be made smaller in the case of the same resistance value as compared with a case where one gate built-in resistor is provided. Therefore, it is possible to suppress the potential occurring in the well region 42 under each gate built-in resistance under application of high dV/dt caused by switching.

Furthermore, as described above, since the source contact 13B for electrically connecting the source wire 12B and the well region 42 is provided between the gate built-in resistor 20A and the gate built-in resistor 20B, the displacement current is also drawn out to the source wire 12B. As described with respect to the fourteenth embodiment, three or more gate built-in resistors may be provided in parallel, and the source wire and the source contact may be provided between the gate built-in resistors.

Sixteenth Embodiment

Figure 26:
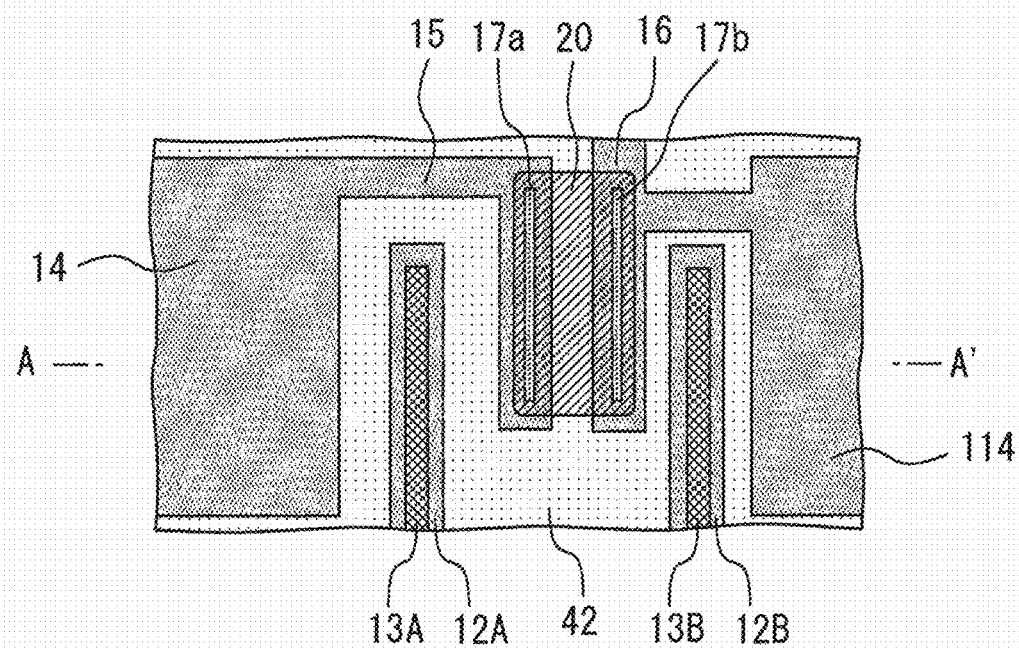
FIG. 26 is a plan view showing a silicon carbide semiconductor device according to a sixteenth embodiment.

FIG. 26 is a plan view showing a silicon carbide semiconductor device according to a sixteenth embodiment. In FIG. 26, the silicon carbide semiconductor device is shown while polysilicon connected to the field insulating film 47, the interlayer insulating film 50 and the gate built-in resistor 20 is omitted from the illustration for the sake of simplicity. The silicon carbide semiconductor device having the gate built-in resistor is provided with a monitor pad for measuring the value of the gate built-in resistance in some cases. The silicon carbide semiconductor device of the present embodiment is based on a configuration similar to any one of the fourth to sixth embodiments, and further includes a gate built-in resistance monitor pad 114 for measuring the gate built-in resistance value of the gate built-in resistor 20.

A gate built-in resistance monitor pad 114 is connected to the gate wire 16. The gate built-in resistance monitor pad 114 may be formed of the same material as the gate wire 16, for example. The source wire 12B and the source contact 13B are provided at positions where they are sandwiched between the gate built-in resistance monitor pad 114 and the gate built-in resistor 20. The source contact 13B electrically connects the source wire 12B and the well region or the low resistance region having lower resistance than the well region.

Figure 27:
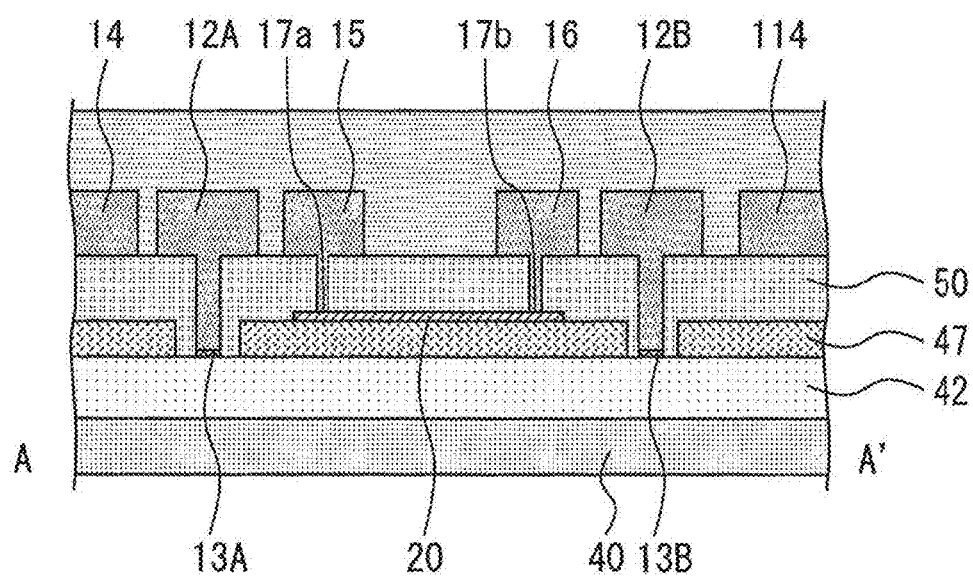
FIG. 27 is a cross-sectional view showing a silicon carbide semiconductor device according to the sixteenth embodiment.

FIG. 27 is a cross-sectional view taken along a line A-A' of FIG. 26. The source contact 13A and the source contact 13B are provided on the left and right sides of the gate built-in resistor 20. Under application of high dV/dt caused by switching, the displacement current occurring in the well region 42 under the gate built-in resistor 20 is drawn out to the source wire 12 through the source contacts provided on both the sides of the gate built-in resistor 20. Therefore, it is possible to suppress the potential occurring in the well region 42 under the gate built-in resistor 20 and prevent the device breakdown caused by the short-circuit between the gate and the source. The gate wires in the first to sixteenth embodiments are, for example, wires to which a gate driving signal of SiC-MOSFET is supplied as in the case of a gate wire of a seventeenth embodiment. Furthermore, the semiconductor devices described in the foregoing embodiments and semiconductor devices described in the following embodiments can be made as SiC-MOSFET chips. Such MOSFET can be made as a planar type or a trench type. Further, the semiconductor devices may be made IGBT adopting an MOS structure.

Seventeenth Embodiment

FIG. 28 is a plan view showing a silicon carbide semiconductor device 10 according to a seventeenth embodiment. The silicon carbide semiconductor device 10 is a SiC-MOSFET chip. The silicon carbide semiconductor device 10 is provided with the source wire 12 formed of, for example, aluminum. A gate pad 14 is provided at a corner of the chip. The gate pad 14 is a portion to which a wire is connected. The gate pad 14 is provided with a gate driving signal from the outside via the wire. The gate wire 16 is connected to the gate pad 14 via the gate built-in resistors 20A and 20B. Since the gate built-in resistors 20A and 20B are embedded in the silicon carbide semiconductor device 10, they are not visible in plan view. However, for convenience of description, the positions of the gate built-in resistors 20A and 20B in plan view are shown.

The gate built-in resistors 20A and 20B are resistors through which the gate pad 14 and the gate wire 16 are connected to each other. The gate wire 16 is formed along the outer periphery of the chip so as to surround the most part of the source wire 12. The gate built-in resistors may be provided only at an end portion of a region sandwiched by the gate pad 14 and the source wire 12.

The source wire 12 includes a main body portion 12A', a just-above portion 12B', an enclosing portion 12C', and a protruding portion 12D'. The main body portion 12A' is provided in a cell region. The just-above portion 12B' is a portion just above the gate built-in resistor 20B. The enclosing portion 12C' is a portion that is provided along the outer edge of the chip so as to surround the gate pad 14. The enclosing portion 12C' is connected to the main body portion 12A' via the just-above portion 12B'. The protruding portion 12D' is a portion sandwiched by the gate pad 14 in plan view. Since the gate pad 14 exists in a y positive direction and a y negative direction of the protruding portion 12D', the protruding portion 12D' is sandwiched by the gate pad 14. The protruding portion 12D' is provided to protrude from the main body portion 12A' in plan view. The protruding portion 12D' is connected to the main body portion 12A'.

Since the protruding portion 12D' is formed as a part of the source wire 12, the gate built-in resistor 20B is sandwiched by the protruding portion 12D' and the main body portion 12A' in plan view. That is, the protruding portion 12D' exists in the y positive direction of the gate built-in resistor 20B, and the main body portion 12A' exists in the y negative direction of the gate built-in resistor 20B.

Figure 29:
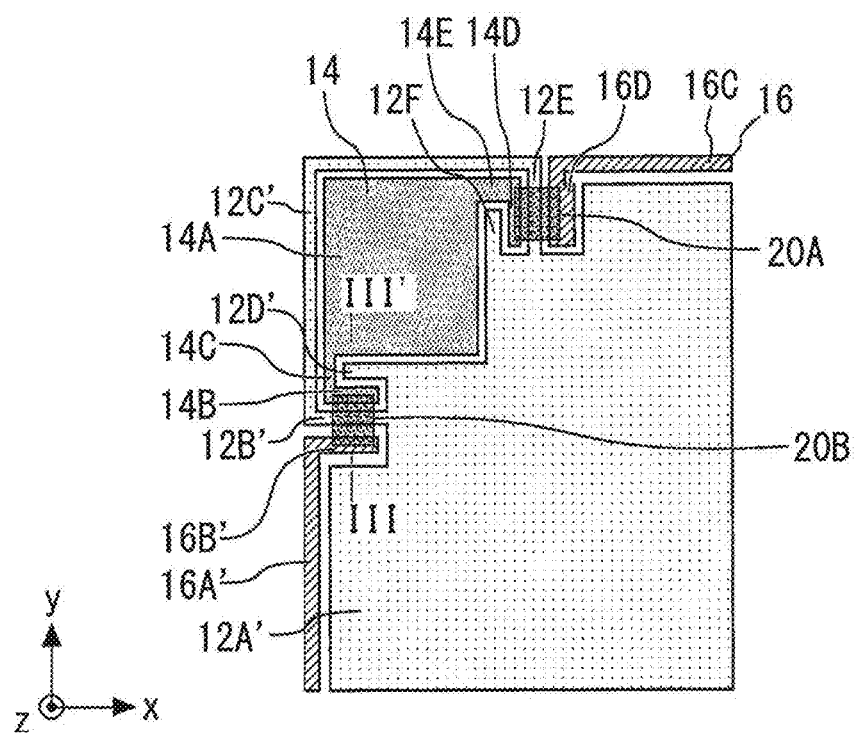
FIG. 29 is a partially enlarged view of FIG. 28.

FIG. 29 is a partially enlarged view of FIG. 28. The gate pad 14 includes a main body portion 14A, first connecting portions 14B and 14D, and second connecting portions 14C and 14E. A wire is connected to the main body portion 14A. The main body portion 14A is connected to the first connecting portions 14B and 14D through the second connecting portions 14C and 14E, respectively. The protruding portion 12D' which is a part of the source wire 12 is sandwiched by the main body portion 14A and the first connecting portion 14B. A protruding portion 12F which is a part of the source wire 12 is sandwiched by the main body portion 14A and the first connecting portion 14D.

The gate wire 16 has annular portions 16A' and 16C formed along the outer periphery of the chip, a connecting portion 16B' connected to the annular portion 16A', and a connecting portion 16D connected to the annular portion 16C. A gate driving signal is supplied from the gate pad 14 to the gate wire 16 via the gate built-in resistors 20A and 20B. A gate voltage is applied to the gate of a unit cell from the annular portions 16A' and 16C and the connecting portions 16B' and 16D.

A just-above portion 12E which is a part of the source wire 12 exists above the gate built-in resistor 20A. The just-above portion 12E connects the enclosing portion 12C' and the main body portion 12A' to each other. As described above, the gate built-in resistor 20B for connecting the first connecting portion 14B and the connecting portion 16B' exists in the y negative direction of the gate pad 14, and the gate built-in resistor 20A for connecting the first connecting portion 14D and the connecting portion 16D exists in the x positive direction.

Figure 30:
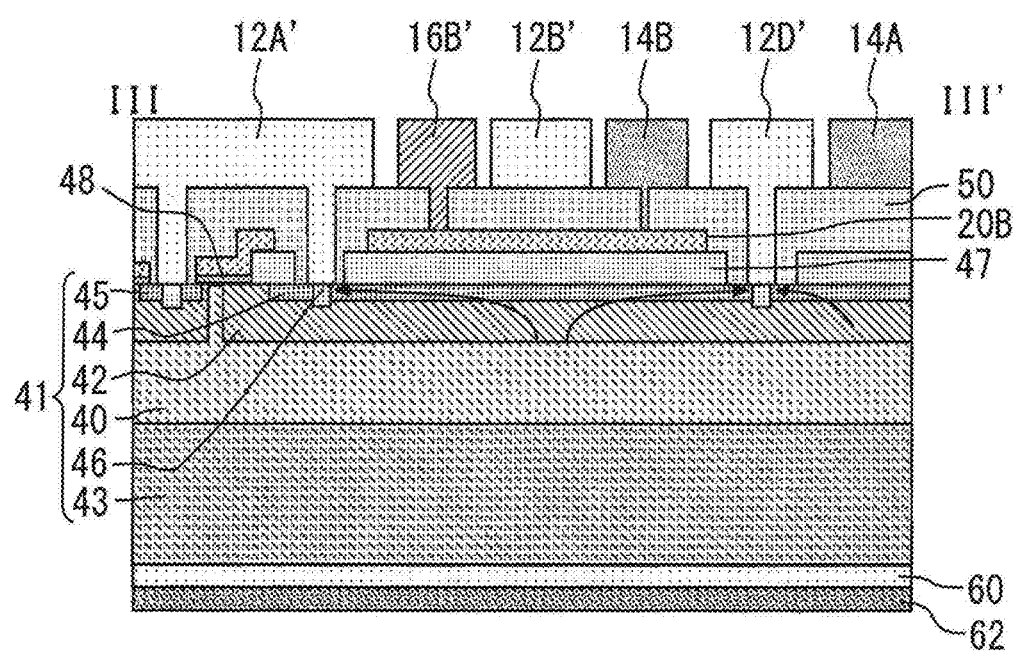
FIG. 30 is a cross-sectional view taken along a line III-III' of FIG. 29.

FIG. 30 is a cross-sectional view taken along a line III-III' (a source contact hole portion, a gate contact hole portion) of FIG. 29. The silicon carbide semiconductor device 10 includes a silicon carbide semiconductor substrate 41 formed of silicon carbide as a material. The silicon carbide semiconductor substrate 41 includes an n-type substrate 43, an n-type drift layer 40, a p-type well region 42 provided on the n-type drift layer 40, and a high-concentration n-type region 44 provided on the p-type well region 42. The high-concentration n-type region 44 is an n$^+$-region doped with n-type impurities at a high concentration ($1 \times 10^{19}$ cm$^{-3}$ or more). The n-type impurity concentration of the high-concentration n-type region 44 is larger than the n-type impurity concentration of the n-type drift layer 40. An n-type source 45 surrounded by the p-type well region 42 is also provided on the silicon carbide semiconductor substrate 41. Furthermore, a p-type contact region 46 is provided so as to be located on the surface of the silicon carbide semiconductor substrate 41 while being in contact with the high-concentration n-type region 44. An n-type substrate 43 exists under the n-type drift layer 40.

A field insulating film 47 and a gate oxide film 48 are provided on the silicon carbide semiconductor substrate 41. A gate built-in resistor 20B formed of polysilicon is provided on the field insulating film 47. The side surface of the gate built-in resistor 20B and a part of the upper surface of the gate built-in resistor 20B are covered with an interlayer insulating film 50. The interlayer insulating film 50 is preferably thicker than the insulating film such as the field insulating film 47. The interlayer insulating film 50 and the field insulating film 47 are preferably thicker than the gate oxide film 48. Plural through-holes are provided in the interlayer insulating film 50 provided on the gate built-in resistor 20B. The first connecting portion 14B which is a part of the gate pad 14 and the connecting portion 16B' which is a part of the gate wire 16 are in contact with the gate built-in resistor 20B through the through-holes.

Plural through-holes are also formed in the interlayer insulating films 50 on the right and left sides of the gate built-in resistor 20B. Through these plural through-holes, the protruding portion 12D' of the source wire 12 is connected to the p-type contact region 46 and the high-concentration n-type region 44, and the main body portion 12A' of the source wire 12 is also connected to the p-type contact region 46 and the high-concentration n-type region 44. FIG. 30 also discloses that the left-side portion of the main body portion 12A' is connected to the p-type contact region 46 and the source 45.

FIG. 30 shows that the first connecting portion 14B of the gate pad 14 and the connecting portion 16B' of the gate wire 16 are connected to the gate built-in resistor 20B. The high-concentration n-type region 44 is provided under the gate built-in resistor 20B via the field insulating film 47. The main body portion 12A' which is a part of the source wire 12 and the protruding portion 12D' are connected to the high-concentration n-type region 44. In order to suppress the short-circuit between the gate and the source, it is necessary to surely insulate the gate built-in resistor 20B and the high-concentration n-type region 44 from each other by the field insulating film 47.

The back surface structure of the silicon carbide semiconductor device 10 will be described. A drain electrode 62 formed of metal is formed on the bottom surface of an ohmic electrode 60 on the back surface of the silicon carbide semiconductor substrate 41. Therefore, the foregoing n-type substrate 43 is provided between the n-type drift layer 40 and the ohmic electrode 60. As a result, the silicon carbide semiconductor device for power shown in the cross-sectional view of FIG. 30 is completed. A cross-section taken along a line traversing the gate built-in resistor 20A in the x direction is the same as that in FIG. 30.

Figure 31:
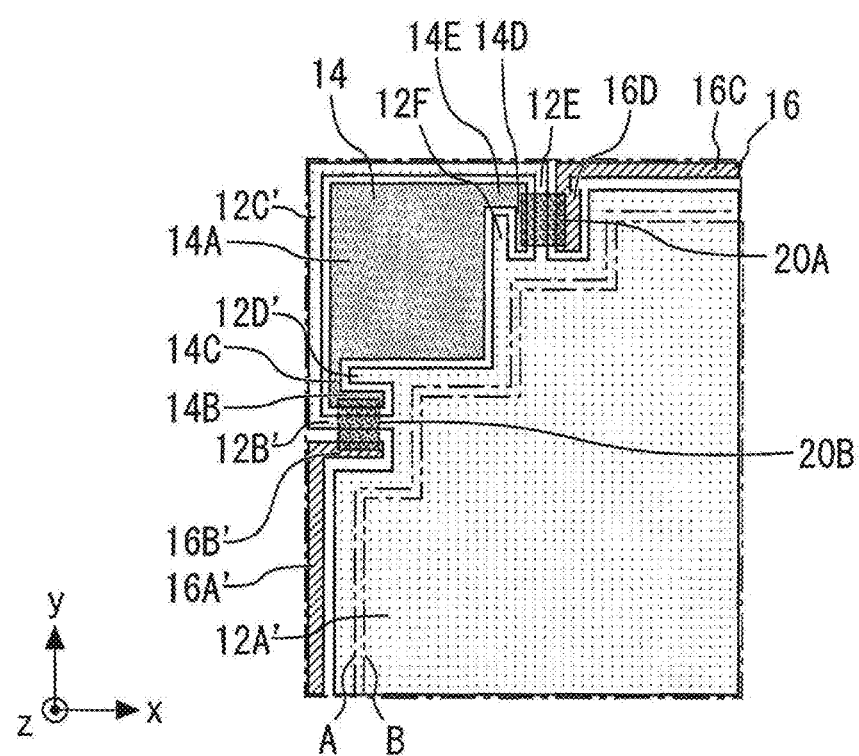
FIG. 31 is a diagram showing an ion implantation region when the n-type region and the source are formed.

FIG. 31 is a diagram showing an ion implantation region when the high-concentration n-type region 44 and the source 45 are formed. The high-concentration n-type region 44 and the source 45 may be formed by the same ion implantation. Basically, n-type impurities are doped into regions A and B surrounded by one-dotted chain lines. The region A includes a portion where the gate built-in resistors 20A and 20B are formed. The region B includes a portion where the main body portion 12A' of the source wire 12 is formed. In the region B, a unit cell of MOSFET is formed like a center portion of FIG. 2 of JP 2012-109602 A. Instead of formation of the source 45 over the entire surface of the region B, the source is partially formed like a source region 80 of FIG. 3 of JP 2012-109602 A. The region B has a region doped with no n-type impurities just under source contact holes provided at regular intervals. Furthermore, the n-type impurities are not doped over the entire surface of the region A, but there is a region doped with no n-type impurities just under the main body portion 12A', the enclosing portion 12C' and the protruding portions 12D' and 12F of the region A.

Figure 32:
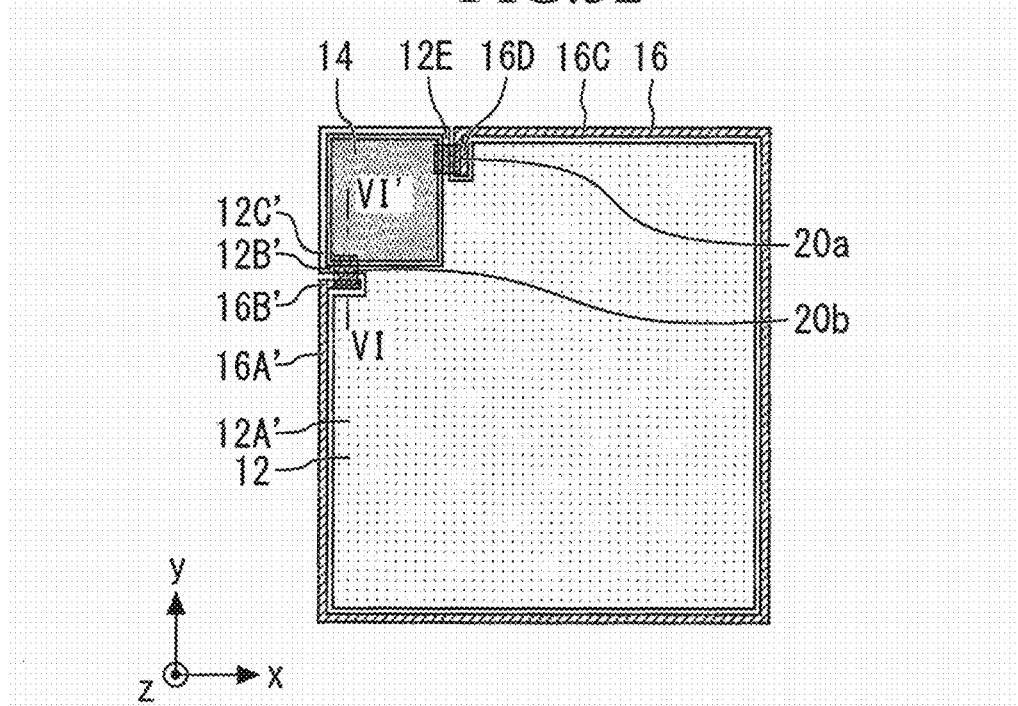
FIG. 32 is a plan view showing the silicon carbide semiconductor device according to a first comparative example.
Figure 33:
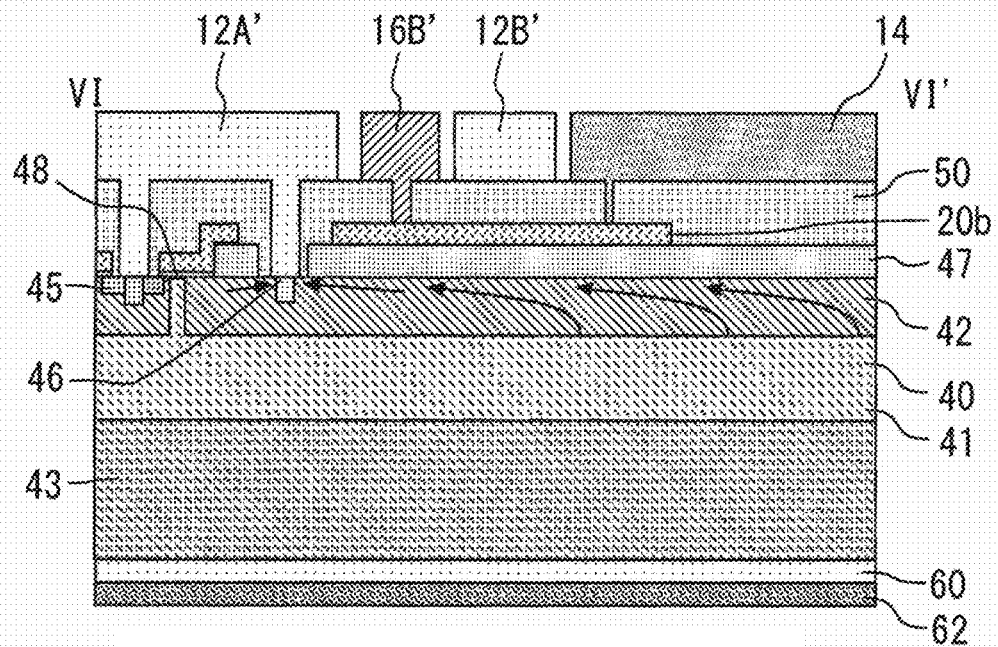
FIG. 33 is a cross-sectional view showing the silicon carbide semiconductor device according to the first comparative example.
Figure 34:
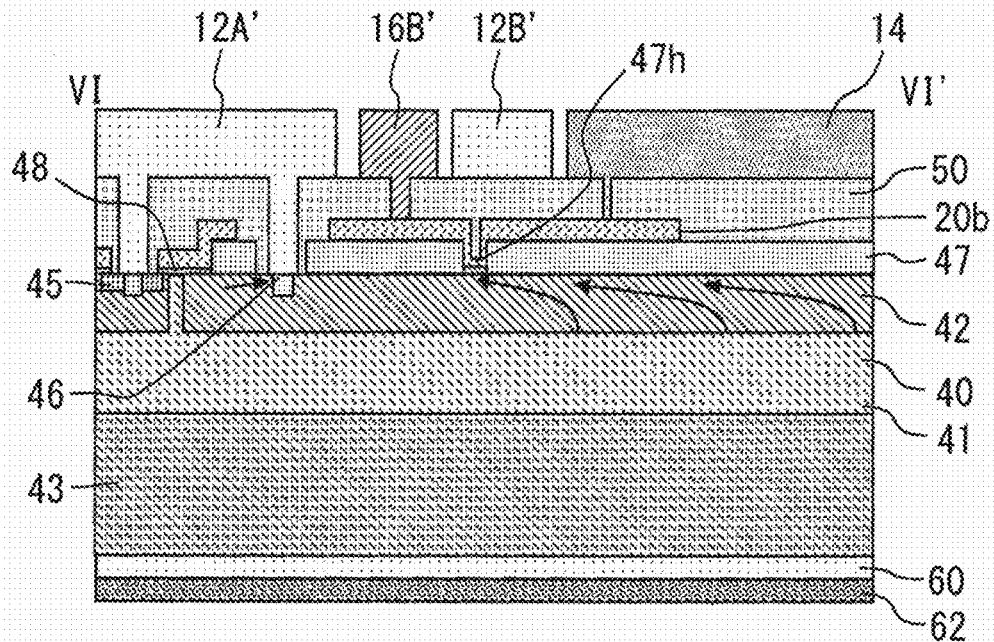
FIG. 34 is a cross-sectional view showing the silicon carbide semiconductor device according to the first comparative example.
Figure 35:
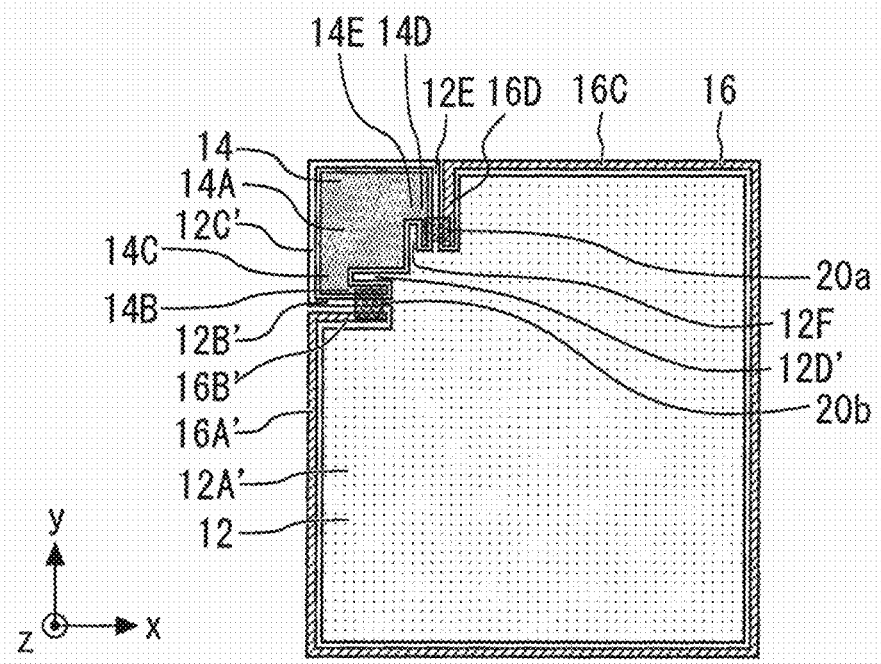
FIG. 35 is a plan view showing the silicon carbide semiconductor device according to a second comparative example.

Here, in order to facilitate the description on the technical significance of the silicon carbide semiconductor device according to the seventeenth embodiment, comparative examples will be described. FIGS. 32 to 34 are diagrams of a silicon carbide semiconductor device according to a first comparative example. FIG. 35 is a plan view showing a silicon carbide semiconductor device according to a second comparative example. The first comparative example and the second comparative example will be described while focusing on different points from the silicon carbide semiconductor device 10 of the seventeenth embodiment. Those configurations which will not be particularly described are the same as that of the silicon carbide semiconductor device 10.

FIG. 32 is a plan view showing the silicon carbide semiconductor device according to the first comparative example. The source wire 12 of the first comparative example includes the main body portion 12A', the just-above portions 12B' and 12E, and the enclosing portion 12C', but does not include the protruding portions 12D' and 12F described above. Gate built-in resistors 20a and 20b have the same function as the gate built-in resistors 20A and 20B of the silicon carbide semiconductor device 10.

FIG. 33 is a cross-sectional view taken along a line VI-VI' in FIG. 32. The p-type well region 42 is provided just under the gate built-in resistor 20b via the field insulating film 47. The p-type well region 42 which is a $p^+$-region can be formed by ion-implanting Al or B into the semiconductor substrate. The p-type well region 42 is formed under the gate pad 14 and the gate built-in resistor 20b. The n-type region described above does not exist just under the gate built-in resistor 20b. In addition, the source wire 12 of the first comparative example does not have the protruding portion 12D'. Therefore, only the main body portion 12A' of the source wire 12 is connected to the p-type well region 42 just under the gate built-in resistor 20b.

FIG. 34 is a cross-sectional view showing the silicon carbide semiconductor device of the first comparative example in which a pin hole is formed in the field insulating film 47. In this case, only a thin gate oxide film 48 is provided between the gate built-in resistor 20b and the p-type well region 42. In this case, there is a risk that the gate oxide film 48 is deteriorated at high dV/dt, so that the gate and the source are short-circuited to each other.

On the other hand, in the silicon carbide semiconductor device 10 according to the seventeenth embodiment, for example, N (nitrogen) or P (phosphor) is ion-implanted into the silicon carbide semiconductor substrate 41 to form the high-concentration n-type region 44. More specifically, there are provided the high-concentration n-type region 44 in contact with the bottom surface of the field insulating film 47 which is an insulating film, the p-type well region 42 in contact with the bottom surface of the high-concentration n-type region 44, and the n-type drift layer 40 in contact with bottom surface of the well region 42. In the case where the material of the silicon carbide semiconductor substrate 41 is silicon carbide, the resistance of the $n^+$-region is lower than that of the $p^+$-region. Therefore, provision of the high-concentration n-type region 44 makes it possible to reduce the resistance of a path through which the displacement current under the gate pad 14 and the gate built-in resistors 20A, 20B flows. This makes it possible to suppress the potential difference between the gate pad 14 and the gate built-in resistors 20A, 20B and the just-under silicon carbide semiconductor substrate 41, which is caused by the displacement current caused by application of dV/dt.

Next, the significance of the protruding portion 12D' included in the source wire 12 of the silicon carbide semiconductor device of the seventeenth embodiment will be described. For example, in a switching operation in which high dV/dt of 100 kV/p sec or more is applied, even when high-concentration n-type region 44 is formed, the potential occurring in the p-type well region 42 under the gate built-in resistor may increase to 100 V or more due to a displacement current flowing from the lower side of the gate pad 14 to the source wire 12. In this case, when there is a pinhole in the field insulating film 47, there is a concern about deterioration of the gate oxide film 48.

Therefore, in addition to provision of the high-concentration n-type region 44, protruding portions 12F and 12D which are parts of the source wire 12 are provided between the main body portion 14A of the gate pad 14 and the gate built-in resistors 20A and 20B. The lower end portions of the protruding portions 12F and 12D are connected to the p-type contact region 46 and the high-concentration n-type region 44, respectively. FIG. 30 shows that the lower end portion of the protruding portion 12D' is connected to the p-type contact region 46 and the high-concentration n-type region 44. The lower end portion of the protruding portion 12D' is in direct contact with not only the p-type contact region 46, but also the high-concentration n-type region 44. A portion for connecting the protruding portion 12D' and the high-concentration n-type region 44 just under the protruding portion 12D' is set as a first contact. A portion for connecting the main body portion 12A' of the source wire 12 and the high-concentration n-type region 44 just under the main body portion 12A' is set as a second contact. The first contact and the second contact sandwich the gate built-in resistor 20B in plan view.

FIG. 30 shows that the first contact for connecting the protruding portion 12D' and the high-concentration n-type region 44 just under the protruding portion 12D', and the second contact for connecting the main body portion 12A' of the source wire 12 and the high-concentration n-type region 44 just under the main body portion 12A' sandwich the gate built-in resistor 20B therebetween. Accordingly, two contact portions between the source wire 12 and the high-concentration n-type region 44 are provided on the left and right sides of the gate built-in resistor 20B. As a result, the displacement current occurring under application of high dV/dt can be drawn out from both the main body portion 12A' and the protruding portion 12D'. In FIG. 30, the flows of the displacement current in the p-type well region 42 and the high-concentration n-type region 44 are indicated by arrows. The potential of the p-type well region 42 can be suppressed by drawing out the displacement current from both the main body portion 12A' and the protruding portion 12D'.

For example, in the case of the first comparative example shown in FIG. 33, since there is no connection between the source wire 12 and the silicon carbide semiconductor substrate 41 under the gate pad 14, the displacement current occurring under the gate pad 14 flows into a connecting portion which is between the main body portion 12A' and the silicon carbide semiconductor substrate 41 and is far away therefrom. Therefore, the potential of the p-type well region 42 becomes high.

On the other hand, in the seventeenth embodiment, the protruding portions 12D' and 12F sandwiched by the gate pad 14 are provided, and the protruding portions 12D' and 12F are connected to the high-concentration n-type region 44. As a result, the displacement currents occurring in the p-type well region 42 and the high-concentration n-type region 44 under the gate pad 14 promptly flow to the protruding portions 12D' and 12F which are closer than the main body portion 12A'. Therefore, the displacement current flowing to the lower side of the gate built-in resistors 20A and 20B can be suppressed, and occurrence of large potential in the silicon carbide semiconductor substrate 41 under the gate built-in resistors 20A and 20B can be suppressed. Suppression of occurrence of the potential brings an effect of preventing deterioration of the gate oxide film 48 in such a case that there is a pinhole in the field insulating film 47.

As described above, the two contacts for connecting the high-concentration n-type region 44 and the source wire 12 are provided so as to sandwich the gate built-in resistor therebetween in plan view, whereby it is possible to prevent occurrence of high potential caused by the displacement current. By electrically connecting the high-concentration n-type region 44 and the source wire 12 at plural locations, it is possible to secure a path through which the displacement current flows and prevent increase of the potential of the silicon carbide semiconductor substrate 41. As a particularly preferable example, the protruding portions 12D' and 12F are cited.

Next, the locations of the gate built-in resistors 20A and 20B will be discussed. FIG. 35 is a plan view showing the silicon carbide semiconductor device according to the second comparative example. The gate built-in resistors 20a and 20b of this silicon carbide semiconductor device are located to be nearer to the center of the chip than the gate built-in resistors 20A and 20B of FIG. 28. That is, the gate built-in resistors 20a and 20b are located farther away from the outer edge of the chip than the gate built-in resistors 20A and 20B of FIG. 28.

Since the gate built-in resistors 20a and 20b of FIG. 35 are apart from the end of the chip, the connecting portions 16B' and 16D and the first connecting portions 14B and 14D must be made longer than that in the case of FIG. 28. In the case of the second comparative example, the ineffective area must be enlarged accordingly.

In the seventeenth embodiment, by arranging the gate built-in resistors 20A and 20B on the end side of the chip, the connecting portions 16B' and 16D and the first connecting portions 14B and 14D can be shortened as compared with the case of the second comparative example. Therefore, it is possible to increase the effective area by increasing the area of the source electrode. When the gate pad 14 is provided along the outer edge of the chip, it is preferable that the positions of the gate built-in resistors 20A and 20B are made closer to the end of the chip than the center of the gate pad 14. In FIG. 29, it is shown that the gate built-in resistor 20A is made closer to the end of the chip by causing the gate built-in resistor 20A to be located farther from the center of the chip in the y positive direction than the center of the gate pad 14. Furthermore, it is also shown that the gate built-in resistor 20B is made closer to the end of the chip by causing the gate built-in resistor 20B to be located farther from the center of the chip in the x negative direction than the center of the gate pad 14.

The silicon carbide semiconductor device according to the seventeenth embodiment can be modified in various ways without losing its features. For example, in a case where it is possible to prevent excessive increase of the potential of the semiconductor substrate just under the gate built-in resistors 20A and 20B only by providing the high-concentration n-type region 44, the protruding portions 12D' and 12F may be omitted. Various types of switching devices using silicon carbide can be adopted as the silicon carbide semiconductor device 10. A withstand voltage holding structure such as a channel stopper, a guard ring or a field plate may be appropriately provided.

In the present embodiment, the gate built-in resistors 20A and 20B are provided on the field insulating film 47. Even when an insulating film other than the field insulating film 47 is provided between the gate built-in resistors 20A, 20 B and the silicon carbide semiconductor substrate 41, an effect brought by providing the high-concentration n-type region 44 can be obtained.

These modifications can also be applied to the silicon carbide semiconductor device according to the following embodiments. Since a silicon carbide semiconductor device according to the following embodiments have many common points to the seventeenth embodiment, different points from the seventeenth embodiment will be mainly described.

Eighteenth Embodiment

Figure 36:
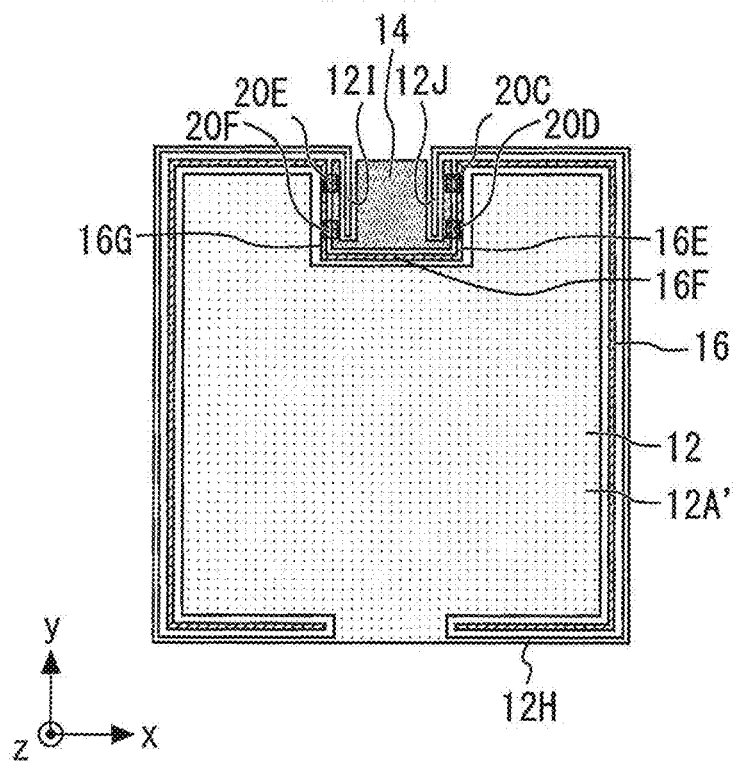
FIG. 36 is a plan view showing a silicon carbide semiconductor device according to an eighteenth embodiment.

FIG. 36 is a plan view showing a silicon carbide semiconductor device according to an eighteenth embodiment. The gate pad 14 is provided not at the corner of the chip, but at the upper end of the center of the chip. Gate built-in resistors 20C, 20D, 20E and 20F are connected to the gate pad 14. The gate built-in resistors 20C and 20D are located on the right side of the gate pad 14, and the gate built-in resistors 20E and 20F are located on the left side of the gate pad 14.

The gate wire 16 is connected to the gate built-in resistors 20C, 20D, 20E and 20F. The gate wire 16 surrounds the main body portion 12A' of the source wire 12 as a whole. The gate wire 16 includes connecting portions 16E and 16G connected to the gate built-in resistors, and an intermediate portion 16F for connecting the connecting portion 16E and the connecting portion 16G. The connecting portion 16E is connected to the gate built-in resistors 20C and 20D. The connecting portion 16G is connected to the gate built-in resistors 20E and 20F.

The source wire 12 includes the main body portion 12A', an annular portion 12H, and protruding portions 12I and 12J. The annular portion 12H is an annular portion connected to the main body portion 12A'. The annular portion 12H surrounds the main body portion 12A' and the gate wire 16. The protruding portions 12I and 12J are connected to the annular portion 12H. The protruding portions 12I and 12J have the same function as the protruding portion of the first embodiment. That is, the protruding portions 12I and 12J are sandwiched by the gate pad 14 in plan view. The gate built-in resistors 20E and 20F are sandwiched by the protruding portion 12I and the main body portion 12A' in plan view. The gate built-in resistors 20C and 20D are sandwiched by the protruding portion 12J and the main body portion 12A' in plan view.

Furthermore, the gate built-in resistors 20E and 20F are sandwiched in plan view by a first contact for connecting the protruding portion 12I and the high-concentration n-type region 44 just under the protruding portion 12I, and a second contact for connecting the main body portion 12A' and the high-concentration n-type region 44 just under the main body portion 12A'. The gate built-in resistors 20C and 20D are sandwiched in plan view by a first contact for connecting the protruding portion 12J and the high-concentration n-type region 44 just under the protruding portion 12J, and a second contact for connecting the main body portion 12A' and the high-concentration n-type region 44 just under the main body portion 12A'. This makes it possible to prevent increase of the potential of the semiconductor substrate just under the gate pad 14 and in the vicinity of the gate pad 14 due to occurrence of the displacement current as in the case of the first embodiment.

Figure 37:
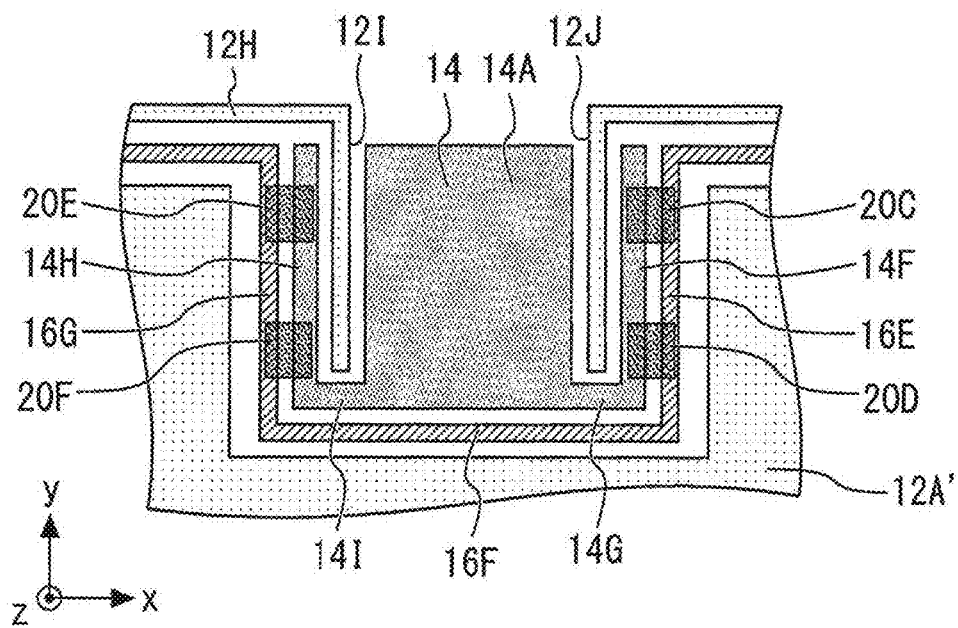
FIG. 37 is a partially enlarged view of FIG. 36.

FIG. 37 is an enlarged view showing the gate pad 14 of FIG. 36 and the vicinity thereof. The gate pad 14 includes the main body portion 14A, first connecting portions 14F and 14H, and second connecting portions 14G and 14I. The first connecting portion 14F has an elongated shape extending in the y direction. The gate built-in resistors 20C and 20D are connected to only the end portions of the first connecting portion 14F with avoiding the center of the first connecting portion 14F. The gate built-in resistors 20E and 20F are connected to only the end portions of the first connecting portion 14H with avoiding the center of the first connecting portion 14H. Therefore, all the gate built-in resistors are provided at only the end portions of the region sandwiched by the gate pad 14 and the source wire 12.

In the region sandwiched by the gate pad 14 and the source wire 12, a central portion of the region is a portion where the largest potential occurs when the displacement current flows. Therefore, by arranging the gate built-in resistors with avoiding the central portion, it is possible to prevent deterioration of the insulating film under the gate built-in resistors.

Figure 38:
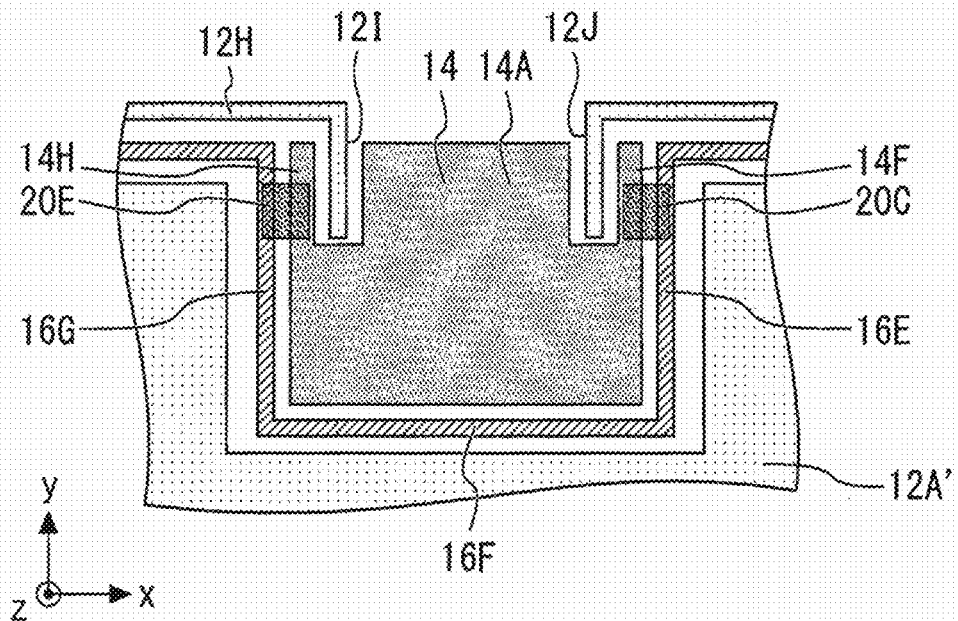
FIG. 38 is a partial plan view showing a silicon carbide semiconductor device according to a modification.

FIG. 38 is a partial plan view showing a silicon carbide semiconductor device according to a modification. Compared with the configuration shown in FIG. 37, the modification differs in that the gate built-in resistors 20D and 20F are not provided, and the gate built-in resistors 20C and 20E on the chip end side are provided. Since only the gate built-in resistors 20C and 20E on the chip end side are provided as the gate built-in resistors, the protruding portions 12I and 12J are shorter than those in FIG. 37. The area of the gate pad 14 is increased by the amount corresponding to the shortening of the protruding portions 12I and 12J.

In the examples shown in FIGS. 36 and 37, the area of the gate pad 14 decreases by only the amount corresponding to the provision of the long protruding portions 12I and 12J. When the area of the gate pad 14 is insufficient, the gate pad 14 may have to be enlarged at the expense of the area of the source wire 12 in some cases. However, as shown in FIG. 38 associated with the modification, by shifting the gate built-in resistors to the chip end side, the protruding portions 12I and 12J can be shortened. As a result, the reduction of the area of the gate pad 14 caused by the provision of the protruding portions 12I and 12J can be suppressed, so that the area of the effective region where the source wire 12 is formed can be kept large. It is preferable that the positions of the gate built-in resistors 20C and 20E are closer to the end of the chip than the center of the gate pad 14.

In the eighteenth embodiment, the four gate built-in resistors are provided, but five or more, or three or less gate built-in resistors may be provided. As shown in FIGS. 36 to 38, it is preferable that plural gate built-in resistors are provided with avoiding the central portion of the region sandwiched by the gate pad 14 and the source wire 12.

Nineteenth Embodiment

Figure 39:
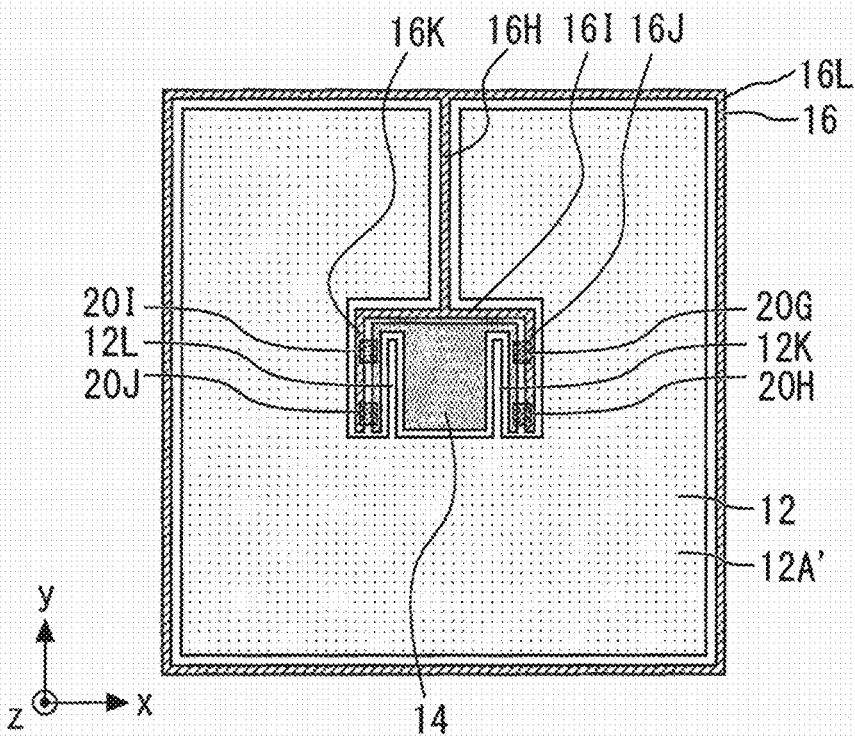
FIG. 39 is a plan view showing a silicon carbide semiconductor device according to a nineteenth embodiment.

FIG. 39 is a plan view showing a silicon carbide semiconductor device according to a nineteenth embodiment. The gate pad 14 is provided at the center of the silicon carbide semiconductor device. The gate wire 16 has an annular portion 16L, a lead-out portion 16H, an intermediate portion 16I, a first connecting portion 16J, and a second connecting portion 16K in plan view. The annular portion 16L is a portion that surrounds the source wire 12. The lead-out portion 16H is a portion that is connected to the annular portion 16L, and extends in a direction from the outer edge of the silicon carbide semiconductor device to the center of the silicon carbide semiconductor device. The lead-out portion 16H has an elongated shape extending in a direction parallel to the y axis.

The intermediate portion 16I is a portion that is connected to the lead-out portion 16H and faces the upper side of the gate pad 14. The first connecting portion 16J is a portion that is connected to the intermediate portion 16I, and faces the right side of the gate pad 14. The second connecting portion 16K is a portion that is connected to the intermediate portion 16I and faces the left side of the gate pad 14.

Figure 40:
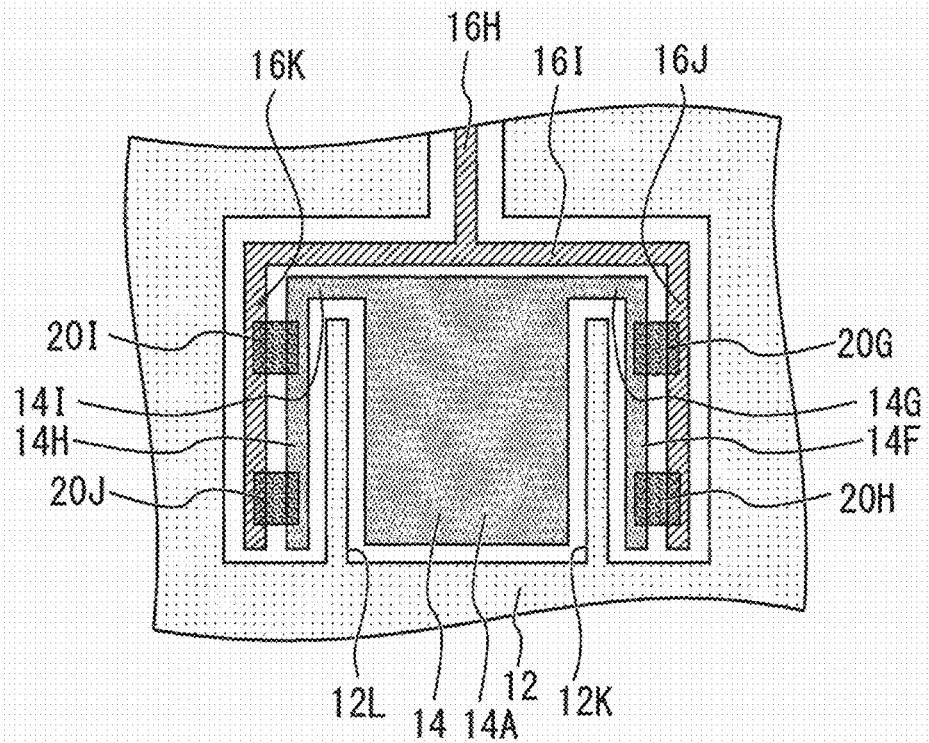
FIG. 40 is a partially enlarged view of FIG. 39.

As shown in FIG. 40 which is a partially enlarged view of FIG. 39, the source wire 12 has a main body portion 12A' and protruding portions 12K and 12L connected to the main body portion 12A'. FIG. 40 shows that a first connecting portion 14F of the gate pad 14 and the first connecting portion 16J are connected to each other by gate built-in resistors 20G and 20H. It is also shown that a first connecting portion 14H of the gate pad 14 and the second connecting portion 16K are connected to each other by gate built-in resistors 20I and 20J.

The center of the region sandwiched by the gate pad 14 and the source wire 12 is a portion where the largest potential occurs when the displacement current flows. Therefore, by arranging the gate built-in resistors 20G, 20H, 20I and 20J while avoiding the center portion of the region, it is possible to prevent deterioration of the oxide film under the gate built-in resistors.

Figure 41:
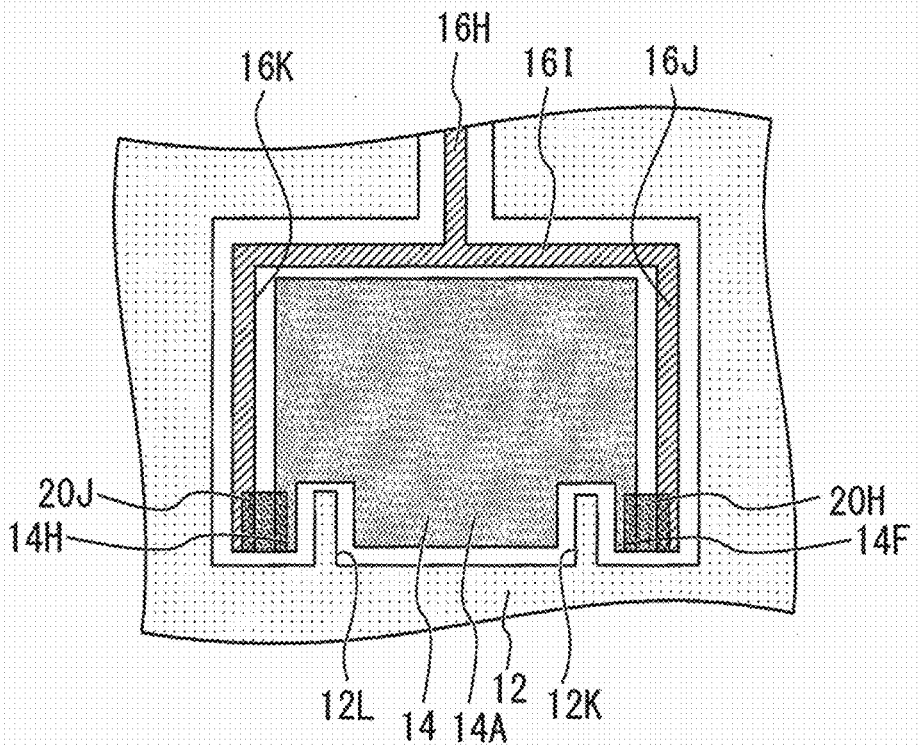
FIG. 41 is a partial plan view showing a silicon carbide semiconductor device according to a modification.

FIG. 41 is a partially plan view of a silicon carbide semiconductor device according to a modification. Compared with the configuration shown in FIG. 40, the modification differs in that the gate built-in resistors 20G and 20I are not provided, and the gate built-in resistors 20H and 20J are provided. The gate built-in resistors 20H and 20J according to the modification are provided to be closer to the lower side of the gate pad 14 than the center of the gate pad 14. In other words, the gate built-in resistors are arranged at the end of the gate pad on the opposite side to a side on which the gate electrode is led in from the end of the chip. As a result, the protruding portions 12K and 12L protruding in a direction from the lower side to the upper side of the gate pad 14 can be made shorter than the protruding portions 12K and 12L of FIG. 40. The area of the gate pad 14 increases by the amount corresponding to the shortened lengths of the protruding portions 12K and 12L.

In the example shown in FIGS. 39 and 40, the area of the gate pad 14 is reduced by the amount corresponding to the provision of the long protruding portions 12K and 12L. When the area of the gate pad 14 is insufficient, the gate pad 14 may have to be enlarged at the expense of the area of the source wire 12 in some cases. However, as shown in FIG. 41 associated with the modification, by shifting the gate built-in resistors 20H and 20J to the lower side of the gate pad 14, the protruding portions 12K and 12L can be shortened. As a result, the reduction of the area of the gate pad 14 caused by the provision of the protruding portions 12K and 12L is suppressed. Therefore, the area of the effective region where the source wire 12 is formed can be kept large.

In the nineteenth embodiment, the four gate built-in resistors are provided, but five or more, or three or less gate built-in resistors may be provided. As shown in FIGS. 39 to 41, it is preferable that the plural gate built-in resistors are provided while avoiding the center portion of the region sandwiched by the gate pad 14 and the source wire 12.

According to some examples, a voltage occurring in a well region under a gate built-in resistor can be reduced, and reliability of a silicon carbide semiconductor device can be enhanced.

The invention claimed is:

1. A silicon carbide semiconductor device comprising:
   a silicon carbide semiconductor substrate having an n-type drift layer, and a p-type well region formed in a surface portion of a part of the drift layer;
   an insulating film provided on the well region;
   a gate built-in resistor formed of polysilicon on a surface of the insulating film;
   an interlayer insulating film formed on the gate built-in resistor;
   a gate contact wire that is connected to a gate pad and formed on the interlayer insulating film, the gate contact wire being narrower than the gate pad in plan view;
   a gate wire provided on the interlayer insulating layer so as to be apart from the gate contact wire;
   a first gate contact for electrically connecting the gate contact wire and the gate built-in resistor; and
   a second gate contact for electrically connecting the gate wire and the gate built-in resistor.

2. The silicon carbide semiconductor device according to claim 1, further comprising a source wire formed on the insulating film or the interlayer insulating film between the gate built-in resistor and the gate pad in plan view, and a source contact for electrically connecting the source wire and the well region.

3. The silicon carbide semiconductor device according to claim 2, wherein the gate built-in resistor and the gate pad face each other.

4. The silicon carbide semiconductor device according to claim 1, further comprising two source wires that sandwich the gate contact wire and the gate wire therebetween in plan view, and are provided along the gate contact wire and the gate wire, and two source contacts for electrically connecting the two source wires and the well region.

5. The silicon carbide semiconductor device according to claim 1, further comprising a source wire having a first portion provided along the gate built-in resistor between the gate built-in resistor and the gate pad, and a second portion that extends in a direction different from that of the first portion and is adjacent to the gate built-in resistor, a first source contact for electrically connecting the first portion and the well region, and a second source contact for electrically connecting the second portion and the well region.

6. The silicon carbide semiconductor device according to claim 1, further comprising a source wire, wherein the source wire has a just-above portion formed above the gate built-in resistor between the gate contact wire and the gate wire via the interlayer insulating film.

7. The silicon carbide semiconductor device according to claim 6, wherein the source wire has an adjacent portion formed on the insulating film or the interlayer insulating film at a position adjacent to the gate pad in plan view, and the silicon carbide semiconductor device further comprises a source contact that penetrates through the insulating film or the interlayer insulating film and electrically connects the adjacent portion and the well region.

8. The silicon carbide semiconductor device according to claim 1, wherein a plurality of structures each comprising the gate built-in resistor, the first gate contact, and the second gate contact are provided, and a plurality of gate built-in resistors are connected in parallel to one another.

9. The silicon carbide semiconductor device according to claim 8, further comprising a source wire formed among the plurality of gate built-in resistors in plan view, and a source contact for electrically connecting the source wire and the well region or a low resistance region having resistance lower than that of the well region.

10. The silicon carbide semiconductor device according to claim 1, further comprising an auxiliary gate built-in resistor formed of polysilicon in contact with a surface of the insulating film, an auxiliary gate wire, a third gate contact for electrically connecting the gate wire and the auxiliary gate built-in resistor, and a fourth gate contact for electrically connecting the auxiliary gate wire and the auxiliary gate built-in resistor, and the gate built-in resistor and the auxiliary gate built-in resistor are connected in series to each other.

11. The silicon carbide semiconductor device according to claim 10, further comprising a source wire formed between the gate built-in resistor and the auxiliary gate built-in resistor in plan view, and a source contact for electrically connecting the source wire and the well region or a low resistance region having lower resistance than the well region.

12. The silicon carbide semiconductor device according to claim 1, further comprising a gate built-in resistance monitor pad connected to the gate wire, a source wire formed at a position where the source wire is sandwiched by the gate built-in resistance monitor pad and the gate built-in resistor, and a source contact for electrically connecting the source wire, the well region or a low resistance region having lower resistance than the well region.

13. The silicon carbide semiconductor device according to claim 1, further comprising a source wire, wherein the gate built-in resistor is provided only at an end portion of a region sandwiched by the gate pad and the source wire.

14. The silicon carbide semiconductor device according to claim 1, wherein the insulating film has the same thickness as a gate oxide film.

15. The silicon carbide semiconductor device according to claim 1, wherein the insulating film has the same thickness as a field insulating film.

16. A silicon carbide semiconductor device comprising:
a silicon carbide semiconductor substrate;
an insulating film provided on the silicon carbide semiconductor substrate;
a gate built-in resistor that is provided on the insulating film and formed of polysilicon;
an interlayer insulating film formed on the gate built-in resistor; and
a gate pad formed on the interlayer insulating film, wherein the silicon carbide semiconductor substrate includes a low resistance region provided under the insulating film under the gate built-in resistor, the low resistance region overlaps the gate built-in resistor in plan view, a p-type well region in contact with a bottom surface of the low resistance region, and an n-type drift layer in contact with a bottom surface of the well region, a bottom surface of the low resistance region, or a bottom surface of the insulating film, and the low resistance region has lower resistance than the well region.

17. The silicon carbide semiconductor device according to claim 16, further comprising a source wire formed on the insulating film or the interlayer insulating film between the gate built-in resistor and the gate pad in plan view, and a source contact for electrically connecting the source wire and the low resistance region.

18. The silicon carbide semiconductor device according to claim 16, wherein the low resistance region is of p-type.

19. The silicon carbide semiconductor device according to claim 16, wherein the low resistance region is of n-type.

20. A silicon carbide semiconductor device comprising:
a silicon carbide semiconductor substrate having an n-type drift layer, and a p-type well region formed in a surface portion of a part of the drift layer;
an insulating film provided on the well region;
a gate built-in resistor formed of polysilicon on a surface of the insulating film;
an interlayer insulating film formed on the gate built-in resistor;
a gate contact wire that is connected to a gate pad and formed on the interlayer insulating film;
a gate wire provided on the interlayer insulating layer so as to be apart from the gate contact wire;
a first gate contact for electrically connecting the gate contact wire and the gate built-in resistor;
a second gate contact for electrically connecting the gate wire and the gate built-in resistor; and
an auxiliary gate built-in resistor formed of polysilicon in contact with a surface of the insulating film, an auxiliary gate wire, a third gate contact for electrically connecting the gate wire and the auxiliary gate built-in resistor, and a fourth gate contact for electrically connecting the auxiliary gate wire and the auxiliary gate built-in resistor,
wherein the gate built-in resistor and the auxiliary gate built-in resistor are connected in series to each other.

21. The silicon carbide semiconductor device according to claim 20, further comprising a source wire formed between the gate built-in resistor and the auxiliary gate built-in resistor in plan view, and a source contact for electrically connecting the source wire and the well region or a low resistance region having lower resistance than the well region.

* * * * *